United States Patent [19]
Dosho et al.

[11] Patent Number: 5,822,236
[45] Date of Patent: Oct. 13, 1998

[54] ANALOG FIFO MEMORY AND SWITCHING DEVICE HAVING A RESET OPERATION

[75] Inventors: Shiro Dosho; Hidehiko Kurimoto; Naoshi Yanagisawa, all of Osaka, Japan

[73] Assignee: Matsushita Electric Industrial Co., Ltd., Osaka, Japan

[21] Appl. No.: 863,209

[22] Filed: May 27, 1997

[30]  Foreign Application Priority Data

May 28, 1996 [JP] Japan ..................................... 8-132965
Oct. 4, 1996 [JP] Japan ..................................... 8-264280

[51] Int. Cl.[6] .................................................. G11C 27/00
[52] U.S. Cl. ............................................. 365/45; 365/221
[58] Field of Search ............................. 365/45, 145, 149, 365/189.05, 189.07, 221, 203

[56]  References Cited

U.S. PATENT DOCUMENTS

| 4,035,667 | 7/1977 | Heller . | |
| 4,970,703 | 11/1990 | Hariharan et al. . | |
| 5,365,485 | 11/1994 | Ward et al. | 365/221 |

FOREIGN PATENT DOCUMENTS

| 0 483 945 A | 5/1992 | European Pat. Off. . |
| 58-104516 | 6/1983 | Japan . |
| 05243857 | 9/1993 | Japan . |

OTHER PUBLICATIONS

K. A. Nishimura et al., "A Monolithgic Analog Video Comb Filter in 1.2–μm CMOS", IEEE Journal of Solid–State Circuit, vol. 28, No. 12, Dec. 1993, pp. 1331–1339.

IEEE International Solid State Circuits Conference, vol. 36, 1 Feb. 1993, pp. 30–31, 257, XP000388013 Nishimura, et al. "A Monolithic Analog Video Comb Filter in 1.2μm CMOS" (whole document).

IEEE Transactions on Nuclear Science, vol. 37, No. 3–01, 1 Jun. 1990, pp. 1230–1236, XP000143133 Kleinfelder, SA "A 4096 Cell Switched Capacitor Analog Waveform Storage Integrated Circuit" p. 1231, paragraph II; fig. 1,2.

*Primary Examiner*—Viet Q. Nguyen
*Assistant Examiner*—David Lam
*Attorney, Agent, or Firm*—McDermott, Will & Emery

[57]  ABSTRACT

The invention provides an analog FIFO memory from which a written analog signal can be accurately read by eliminating errors in the analog signal between the write operation and the read operation. Prior to the read operation for reading the analog signal from a memory cell through a memory bus, a reset operation for setting the memory bus at a predetermined potential is conducted so as to remove a charge stored in a parasitic capacitance of the memory bus. The input terminal of a read circuit is set at a predetermined potential, with a write circuit disconnected from the memory bus by using an input circuit and with the read circuit connected with the memory bus by using an output circuit. In this manner, the memory bus is set at the predetermined potential, and the charge stored in the parasitic capacitance is discharged. At this point, a switch in each memory cell is in an off-state, and hence, a charge corresponding to the analog signal can be retained in the memory cell.

13 Claims, 30 Drawing Sheets

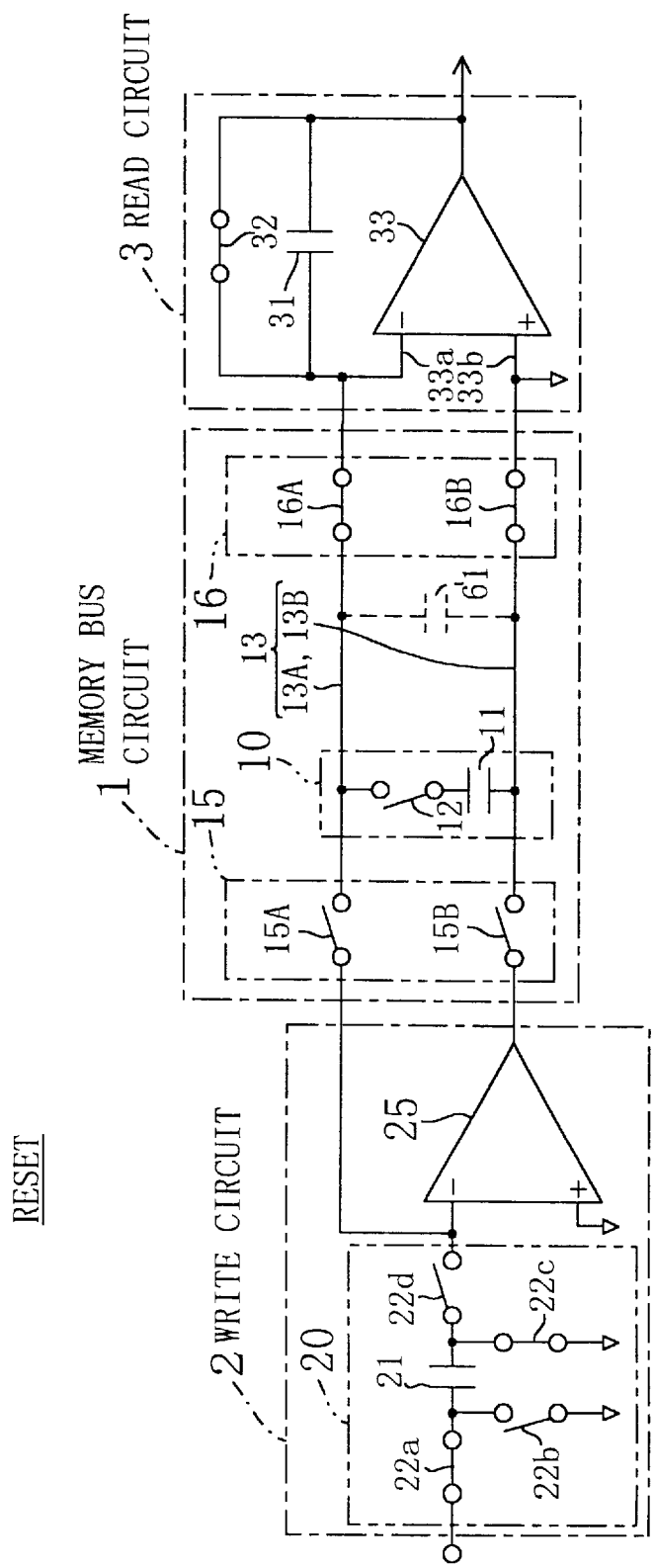

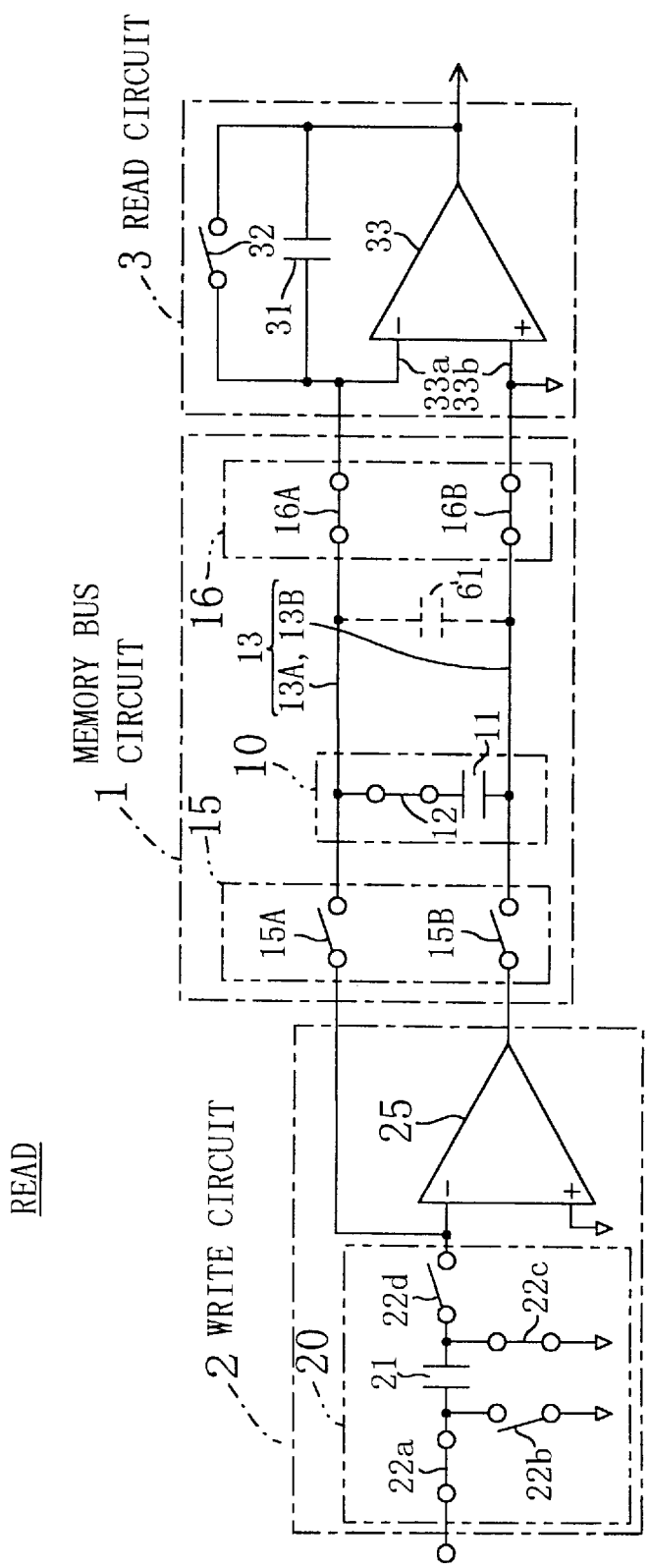

3A READ CIRCUIT

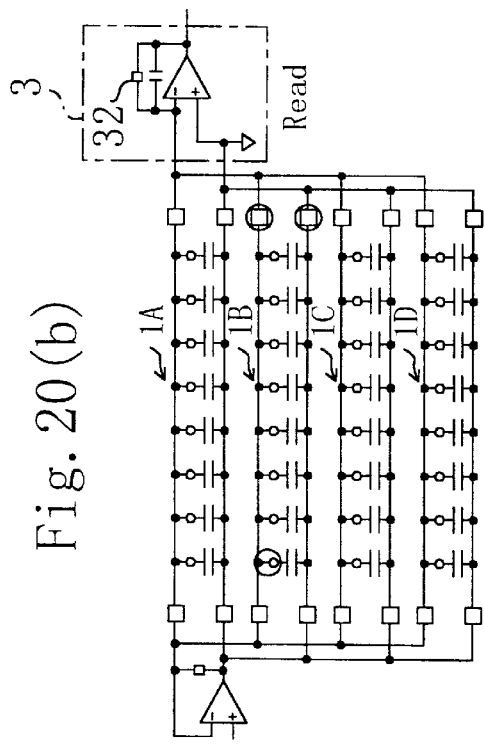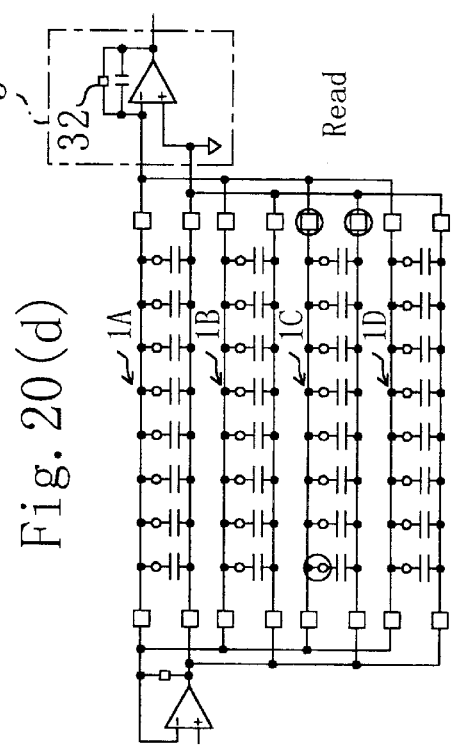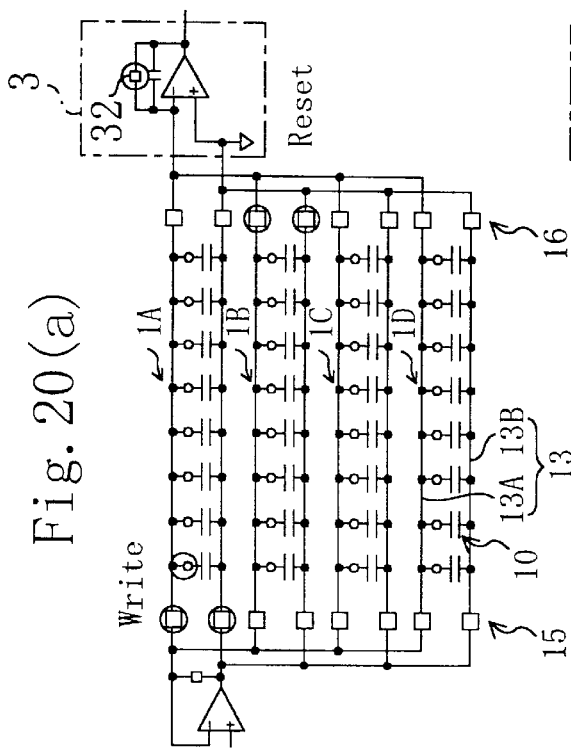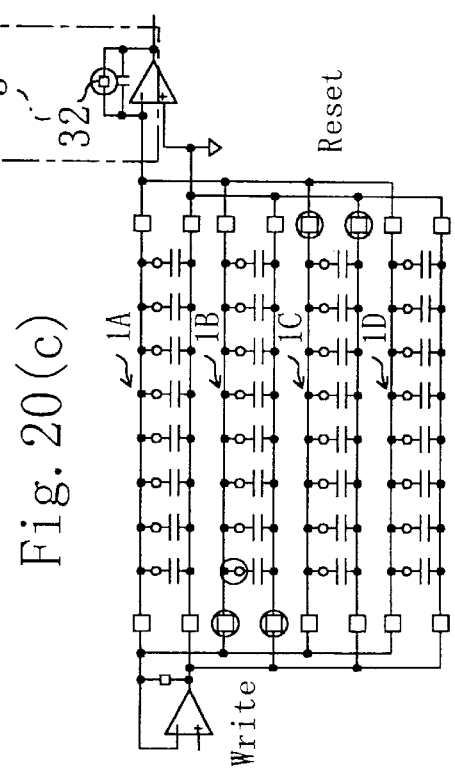

ANALOG FIFO MEMORY AND SWITCHING DEVICE HAVING A RESET OPERATION

BACKGROUND OF THE INVENTION

The present invention relates to an analog FIFO memory, and more particularly, it relates to a technique to improve the accuracy of an analog FIFO memory by eliminating errors in an analog signal between a write operation and a read operation.

As is well known, conventional TV signal processing techniques are realized by using analog circuits. Among the TV signal processing techniques, one most remarkably developing these years is Y/C separation, which is a technique to separate a luminance signal (Y signal) and a color difference signal (© signal) from a color TV signal. The Y/C separation is conventionally conducted by using an analog band pass filter and an analog band elimination filter, but recently, Y/C separation effectively utilizing the characteristic of a color TV signal has been realized.

This Y/C separation will now be described with reference to FIGS. 26(a) and 26(b). FIG. 26(a) is a diagram for illustrating frequency spectra of an NTSC color TV signal. As is shown in FIG. 26(a), the frequency spectrum of the luminance signal of the NTSC color TV signal is distributed in a range from DC to approximately 4.2 MHZ with modified at a frequency of a horizontal synchronizing signal of the NTSC color TV signal. In contrast, the frequency spectrum of the color difference signal is distributed with 3.57954 MHZ at the center in a zigzag manner against the luminance signal with similarly modified at the frequency of the horizontal synchronizing signal of the NTSC color TV signal. Accordingly, in order to separate the luminance signal (Y signal) and the color difference signal (© signal), it is necessary to realize a filter having a transfer function as is shown in FIG. 26(b).

For this purpose, the NTSC color TV signal (NTSC composite) is delayed by one cycle of the horizontal synchronizing signal thereof, so as to be added to or subtracted from the original NTSC color TV signal as is shown in FIG. 27(a). In other words, for realizing the aforementioned Y/C separation, an analog memory circuit is required for delaying the NTSC color TV signal by one cycle of the horizontal synchronizing signal.

Conventionally, a CCD circuit is used as such an analog memory circuit. However, the CCD circuit is manufactured by a different processing technique from the silicon process for manufacturing a bipolar transistor and a CMOS transistor. Therefore, the CCD circuit has a disadvantage that it cannot be formed on the same silicon wafer as the bipolar transistor and the CMOS transistor. Accordingly, a conventional TV signal LSI is externally provided with an analog memory including a CCD circuit as is shown in FIG. 27(b), so as to realize an NTSC color TV signal processor.

In view of this disadvantage, attempts have been made to realize a one-chip TV signal LSI as is shown in FIG. 27(c) by forming an analog FIFO memory out of a bipolar transistor and a CMOS transistor circuit.

FIG. 28(a) is a diagram for showing the fundamental configuration of a conventional analog FIFO memory (disclosed by Ken A. Nishimura, et al., in "A Monolithic Analog Video Comb Filter in 1.2-$\mu$m CMOS", IEEE Journal of Solid-State Circuit, Vol. 28, No. 12, December 1993, pp. 1331–1339). In FIG. 28(a), a reference numeral 1 denotes a memory bus circuit including memory buses 13A and 13B connected with a memory cell 10, a reference numeral 2 denotes a write circuit, including a switched capacitor sample and hold (SCSH) circuit 20 and an operational amplifier 25, for writing an input signal in the memory cell 10 of the memory bus circuit 1, and a reference numeral 3 denotes a read circuit for reading an output signal from the memory cell 10 of the memory bus circuit 1. The memory bus circuit 1 includes an input circuit 15 for controlling a signal input from the write circuit 2 and an output circuit 16 for controlling a signal output to the read circuit 3. In this description, the conventional analog FIFO memory of FIG. 28(a) is assumed to be driven by high-active two-phase clock signals $\phi1$ and $\phi2$ as is shown in FIG. 28(b).

When the clock signal $\phi1$ is activated, the SCSH circuit 20 turns on switches 22a and 22c, thereby sampling and holding an input analog signal in a capacitance device 21. Furthermore, switches 16A and 16B of the output circuit 16 are turned on, and both the memory buses 13A and 13B attain an analog ground potential. Therefore, a charge stored in a capacitance device 11 of the memory cell 10 is transferred to a capacitance device 31 of the read circuit 3 in accordance with the principle of conservation of charge.

Next, when the clock signal $\phi2$ is activated, the SCSH circuit 20 turns on switches 22b and 22d, and the analog ground potential is applied to the both ends of the capacitance device 21. As a result, a charge in the capacitance device 21 is transferred to the capacitance device 11 of the memory cell 10 in accordance with the principle of conservation of charge. It is needless to say that switches 15A and 15B of the input circuit 15 are in an on-state at this point. Also, an analog switch 32 of the read circuit 3 is turned on, and a charge stored in the capacitance device 31 is discharged. When the clock signal $\phi1$ is activated again, a charge stored in the capacitance device 11 of the memory cell 10 is transferred to the capacitance device 31 in accordance with the principle of conservation of charge as in the previous activation.

Through this operation, an analog signal sampled by the SCSH circuit 20 is once stored in the memory cell 10 and then transferred to the capacitance device 31 of the read circuit 3. At this point, when the capacitance device 21 is assumed to have a capacitance value C1 and an input signal voltage is indicated as Vin, the charge Qin stored in the capacitance device 21 can be represented as follows:

$$Qin = Vin \cdot C1 \tag{1}$$

The charge stored in the capacitance device 21 is directly transferred to the capacitance device 11 of the memory cell 10, and therefore, the same charge Qin is stored in the capacitance device 11. Furthermore, the charge stored in the capacitance device 11 is transferred to the read circuit 3. Therefore, when the capacitance device 31 is assumed to have a capacitance value C3, a voltage Vout generated at the ends of the capacitance device 31 at this point can be represented as follows:

$$Vout = Vin \cdot C1/C3 \tag{2}$$

The aforementioned operation is an ideal one, and the conventional circuit has no problem as far as this ideal operation can be practically realized. Actually, however, a written analog signal cannot be always accurately reproduced in the read operation of the conventional analog FIFO memory, namely, there arise errors in the analog signal between the write operation and the read operation.

Such errors in the analog signal are considered to be caused mainly for the following two reasons:

First, the errors are caused due to an intra-line capacitance between the memory buses.

In the case where an intra-line capacitance 61 is present in the conventional analog FIFO memory of FIG. 28(a), when the clock signal φ1 is activated (namely, in the write operation), a part of the charge to be transferred from the capacitance device 21 of the write circuit 2 to the capacitance device 11 of the memory cell 10 is stored in the intra-line capacitance 61. The charge stored in the intra-line capacitance 61 is directly transferred to the read circuit 3 when the clock signal φ2 is activated (namely, in the read operation). In other words, the charge stored in the intra-line capacitance 61 during the write operation is output from the memory bus circuit 1 in the subsequent read operation.

The analog FIFO memory adopts a read modify write operation, namely, an operation to read an analog signal from a memory cell and subsequently to write another analog signal in the memory cell, and hence, the address of the memory cell is changed after writing an analog signal in one memory cell. In the conventional analog FIFO memory of FIG. 28(a), the address of the memory cell is changed between the activation of the clock signal φ1 and the activation of the clock signal φ2.

Accordingly, the charge stored in the intra-line capacitance 61 during the write operation being output in the subsequent read operation means that a part of an analog signal to be written in one memory cell in the write operation immediately before is added to another analog signal to be read in this read operation which has been written in another memory cell and a signal resulting from the addition is output by the memory bus circuit 1. In other words, an analog signal read from the analog FIFO memory includes an error corresponding to the charge stored in the intra-line capacitance 61 during the write operation immediately before the read operation.

For example, assuming that the charge previously stored in one memory cell is indicated as Qm, when the charge Qm is normally read from this memory cell, the output voltage Vout is represented as follows:

$$Vout = Qm/C3 \quad (3)$$

However, in an analog FIFO memory having an intra-line capacitance Cp, when an analog signal Vs is written in another memory cell (having a capacitance value C2) in the write operation immediately before the read operation, the following charge Qp is stored in the intra-line capacitance Cp:

$$Qp = C1 \cdot Vs \cdot Cp/(Cp+C2) \quad (4)$$

Therefore, in the read operation on this memory cell, a voltage caused by this charge Qp is added to the voltage represented by Formula (3) to be output, and hence, the resultant output voltage Vout is represented as follows:

$$Vout = Qm/C3 + (C1/C3) \cdot Vin \cdot Cp/(Cp+C2) \quad (5)$$

Secondly, the errors are caused by a potential difference in the memory buses between the read operation and the write operation and potential fluctuation in the memory buses in the respective read operations.

In the conventional analog FIFO memory of FIG. 28(a), when the clock signal φ2 is activated and the charge is completed to be transferred from the capacitance device 21 of the write circuit 2 to the capacitance device 11 of the memory cell 10 (i.e., when the write operation is completed), the memory bus 13A has the analog ground potential, while the memory bus 13B has the following potential Vb:

$$Vb = Vang + Vin \quad (6)$$

wherein "Vang" indicates the analog ground potential and "Vin" indicates the potential of the written analog signal. In other words, the potential of the memory bus 13B at the beginning of the read operation is varied due to the influence of the analog signal written immediately before.

On the other hand, when an analog signal is read from the memory cell 10, both the memory buses 13A and 13B have the analog ground potential, and hence, the potentials of the memory buses 13A and 13B at the beginning of the write operation are both set at the analog ground potential.

In this manner, the potential of the memory bus 13B is different between the read operation and the write operation. In addition, the potential of the memory bus 13B in the read operation is fluctuated in each read operation because it is affected by the analog signal written in the write operation immediately before.

When an analog FIFO memory is manufactured through the silicon process, the memory buses have a large number of parasitic capacitances which are difficult to be previously estimated. Therefore, in reading an analog signal from a memory cell, a charge stored in the parasitic capacitance of the memory bus can be read together. As described above, the potential of the memory bus is different between the read operation and the write operation, and in addition, is fluctuated in each read operation. Accordingly, an error derived from the parasitic capacitance of the memory bus can be caused in the analog signal.

In this manner, in the conventional analog FIFO memory, a written analog signal cannot be always accurately reproduced due to the influence of the parasitic capacitance of the intra-line capacitance of the memory bus and the like. Thus, the conventional analog FIFO memory has a problem that errors are caused in the analog signal between the write operation and the read operation.

SUMMARY OF THE INVENTION

The object of the invention is decreasing errors in an analog signal between a write operation and a read operation in an analog FIFO memory, so that a written analog signal can be accurately read.

Specifically, this invention provides the analog FIFO memory for outputting, in an input order, an input analog signal with a predetermined time delay, comprising a memory bus circuit including a plurality of memory cells for storing an analog signal; and a memory bus connected with the memory cells for transferring an analog signal, in which a read operation for reading out an analog signal through the memory bus and a write operation for writing in an analog signal through the memory bus are conducted successively on the memory cells in a predetermined order, and a reset operation for setting the memory bus at a predetermined potential is conducted prior to the read operation in order to remove a charge stored in a parasitic capacitance of the memory bus.

In this analog FIFO memory, the reset operation for setting the memory bus at the predetermined potential is conducted prior to the read operation. Therefore, the charge stored in the parasitic capacitance of the memory bus can be removed, and fluctuation in the potential of the memory bus in each read operation can be avoided. As a result, an analog signal can be read from a memory cell without being affected by the parasitic capacitance of the memory bus. Accordingly, the errors in the analog signal between the read operation and the write operation can be reduced, resulting in reading a written analog signal with high accuracy.

In one aspect, the analog FIFO memory preferably further comprises plural memory units each including the memory bus circuit, the plural units preferably conduct the read operation and the write operation in parallel in a manner that one memory unit conducts the read operation while another memory unit is conducting the write operation, and each of the memory units preferably conducts the reset operation prior to the read operation.

In another aspect of the analog FIFO memory, the memory bus circuit is preferably plural in number, the read operation and the write operation are preferably conducted in one of the plural memory bus circuits and subsequently in another memory bus circuit, and while the read operation and the write operation are conducted in one of the plural memory bus circuits, the reset operation is preferably conducted in another memory bus circuit in which the read operation and the write operation are subsequently conducted.

In these aspects of the analog FIFO memory, the reset operation can be carried out without reducing time allocated to the write operation and the read operation. Accordingly, the resultant analog FIFO memory can attain both high accuracy and low power consumption.

Alternatively, the invention provides the analog FIFO memory for outputting, in an input order, an input analog signal with a predetermined time delay, comprising a memory bus circuit including a plurality of memory cells for storing an analog signal, and a memory bus connected with the memory cells for transferring an analog signal, in which each of the memory cells includes a capacitance device for storing an analog signal in the form of charge; and a switch for controlling connection between the capacitance device and the memory bus, and when one memory cell is selected to be read/written, the switch of the selected memory cell is in an on-state in the read operation and the write operation, and the memory bus circuit further includes a dummy memory cell having a capacitance device connected with the memory bus.

In this analog FIFO memory, the capacitance of the memory cell in writing an analog signal is apparently increased by the dummy memory cell including the capacitance device connected with the memory bus. Therefore, the influence of the parasitic capacitance of the memory bus on the charge transfer can be made relatively small. As a result, the influence of the parasitic capacitance of the memory bus on the input/output characteristic of the analog FIFO memory can be suppressed.

In one aspect of this analog FIFO memory, a plurality of the dummy memory cells are preferably disposed at ends of the memory bus so as to sandwich the plural memory cells.

Thus, impedance variation of the memory bus caused by the positional change of a memory cell to be read/written in the layout can be decreased, so as to stabilize the settling characteristic of the memory bus circuit. As a result, the input/output characteristic of the analog FIFO memory can be improved.

Alternatively, the invention provides the analog FIFO memory for outputting, in an input order, an input analog signal with a predetermined time delay, comprising a plurality of memory cells for storing an analog signal; and a memory bus connected with the memory cells for transferring an analog signal, in which each of the memory cells includes a device for storing an analog signal and a switch for controlling connection between the device and the memory bus, the switch includes a MOS transistor, one of a drain and a source of which is connected with the memory bus, the other of which is connected with the device, and a gate of which receives a control signal, and the MOS transistor has a layout pattern in which the gate is disposed between the source and the drain in order to cut a line of electric force extending from the drain to the source.

In this analog FIFO memory, the source-drain capacitance parasitic on the MOS transistor used as a switch of the memory cell can be remarkably decreased, resulting in decreasing the parasitic capacitance itself of the memory bus.

Furthermore, the invention is useful in other application apart from the analog FIFO memory, and provides the switching device for controlling connection between a device and a signal line, comprising a MOS transistor, one of a drain and a source of which is connected with the device, the other of which is connected with the signal line, and a gate of which receives a control signal, in which the MOS transistor has a layout pattern in which the gate is disposed between the drain and the source in order to cut a line of electric force extending from the drain to the source.

In this switching device, the drain-source capacitance parasitic on the MOS transistor can be remarkably decreased, resulting in largely decreasing the parasitic capacitance formed in the device and the signal line.

BRIEF DESCRIPTION OF THE DRAWINGS

FIGS. 1(a) and 1(b) are diagrams illustrating an analog FIFO memory according to a first embodiment of the invention, wherein FIG. 1(a) shows the outline of its configuration and FIG. 1(b) shows the outline of its operation;

FIG. 4 is a diagram for showing the configuration of the analog FIFO memory of the first embodiment in a state for a reset operation;

FIG. 5 is a diagram for showing the configuration of the analog FIFO memory of the first embodiment in a state for a read operation;

FIGS. 20(a) through 20(d) are diagrams for showing the operation of the analog FIFO memory of the third embodiment;

FIGS. 25(a) through 25(c) are diagrams for illustrating a sixth embodiment of the invention, wherein FIG. 25(a) is a diagram for showing a conventional layout of a transistor, FIG. 25(b) is a diagram for showing a layout of a transistor of the sixth embodiment and FIG. 25(c) is a schematic diagram of a drain-source capacitance parasitic on a transistor working as a switch of a memory cell;

FIGS. 30(a) and 30(b) are diagrams for illustrating the effect of the reset operation according to this invention, wherein FIG. 30(a) shows the frequency characteristic of an analog FIFO memory which does not conduct the reset operation and FIG. 30(b) shows the frequency characteristic of an analog FIFO memory which conducts the reset operation of the invention.

DETAILED DESCRIPTION OF THE INVENTION (Embodiment 1)

Figure 1A:
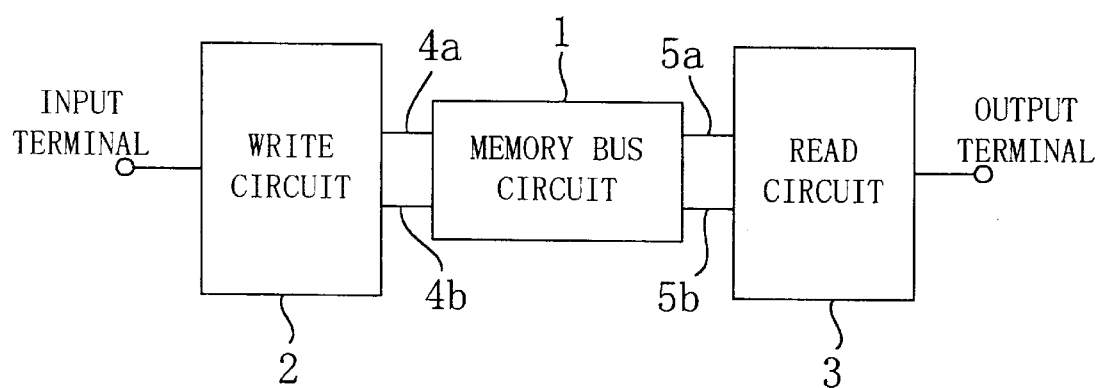
Figure 1B:
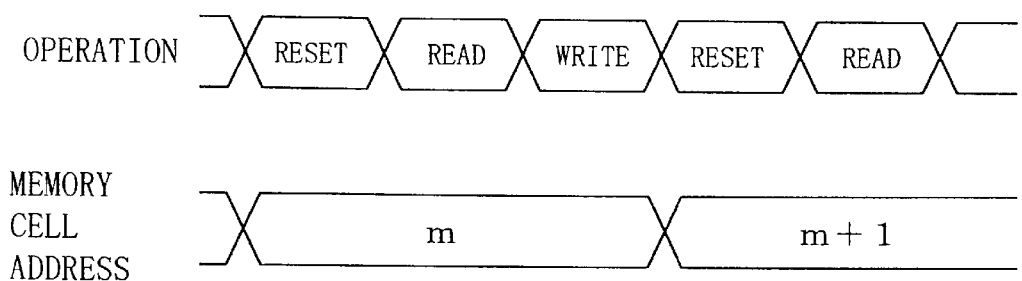

FIGS. 1(a) and 1(b) illustrate an analog FIFO memory according to a first embodiment of the invention, wherein FIG. 1(a) shows the outline of the configuration thereof and FIG. 1(b) shows the outline of the operation thereof.

The analog FIFO memory of this embodiment comprises, as is shown in FIG. 1(a), a memory bus circuit 1 including a memory bus connected with a memory cell for storing an analog signal, a write circuit 2 for writing an analog signal in the memory cell through the memory bus, and a read circuit 3 for reading the analog signal from the memory cell through the memory bus.

As a characteristic of the analog FIFO memory of this embodiment, a reset operation for removing a charge stored in a parasitic capacitance of the memory bus is carried out prior to a read operation. Specifically, as is shown in FIG. 1(b), the operation of this analog FIFO memory is basically divided into three parts, i.e., a reset operation, a read operation and a write operation. First, the memory bus is reset in the reset operation, and subsequently, an analog signal is read from a memory cell (having an address m) connected with the reset memory bus in the read operation. At this point, no charge is stored in the memory cell from which the analog signal has been read, and then, an input signal is written in this memory cell in the write operation.

A conventional analog FIFO memory has a problem that an analog signal read from the analog FIFO memory is affected by another analog signal having been written in the analog FIFO memory immediately before due to the parasitic capacitance of the memory bus. Accordingly, in this embodiment, in order to eliminate the influence of the analog signal written immediately before, the operation for resetting the memory bus is carried out prior to the read operation.

Figure 2:
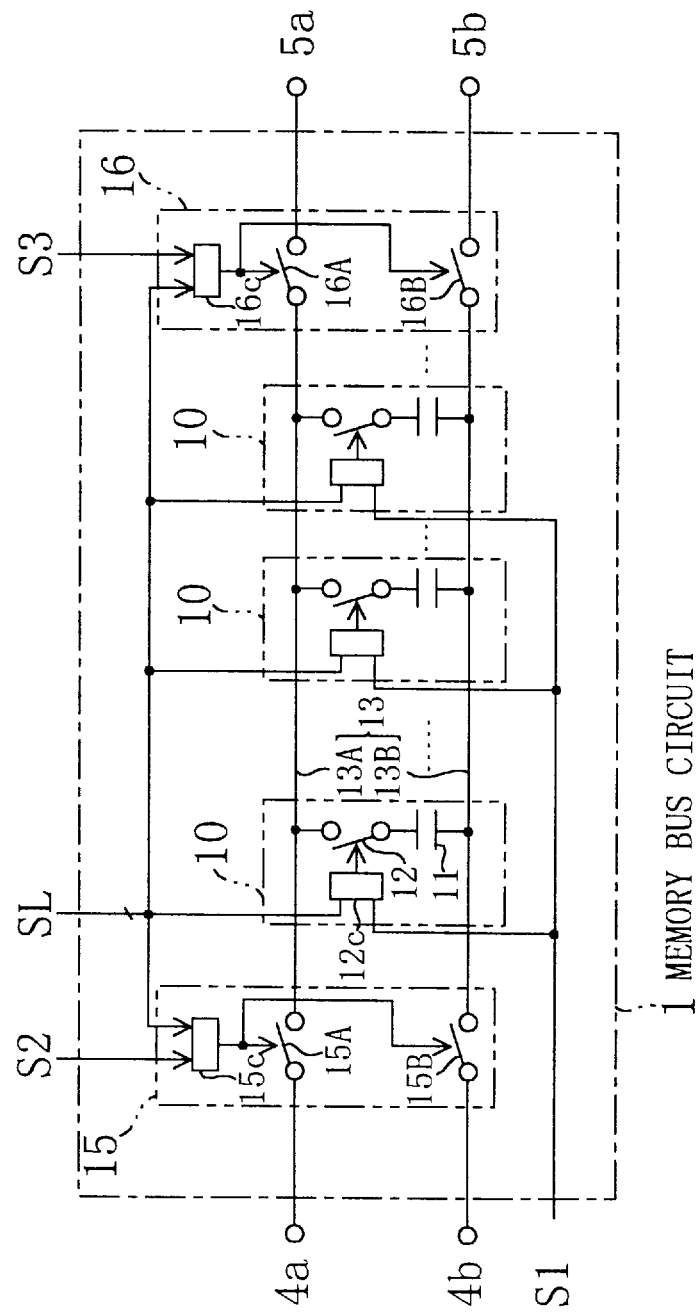
FIG. 2 is a diagram for showing an exemplified configuration of a memory bus circuit.

FIG. 2 is a circuit diagram for showing an exemplified configuration of the memory bus circuit 1. In FIG. 2, a reference numeral 10 denotes a memory cell for storing an analog signal, a reference numeral 13 denotes a memory bus including first and second bus lines 13A and 13B, a reference numeral 15 denotes input means for controlling connection between the write circuit 2 and the memory bus 13, and a reference numeral 16 denotes output means for controlling connection between the read circuit 3 and the memory bus 13. Each memory cell 10 includes a capacitance device 11 for storing an analog signal in the form of a charge, and a switch 12 serially connected between the first and second bus lines 13A and 13B. The switch 12 is controlled to be turned on/off by switch control means 12c operated in accordance with a memory cell switch driving signal S1 and a memory cell selecting signal SL. The input means 15 includes switches 15A and 15B, which are controlled to be turned on/off by switch control means 15c operated in accordance with an input switch driving signal S2 and the memory cell selecting signal SL. The output means 16 includes switches 16A and 16B, which are controlled to be turned on/off by switch control means 16c operated in accordance with an output switch driving signal S3 and the memory cell selecting signal SL.

The reset operation for the memory bus is, for example, in the memory bus circuit 1 of FIG. 2, an operation to make the first and second bus lines 13A and 13B have the same potential or a constant potential difference from each other. Thus, the charge stored in the parasitic capacitance of the memory bus 13 is made 0 (zero) or constant, so that the read operation for an analog signal cannot be affected by another analog signal written immediately before.

Figure 3A:
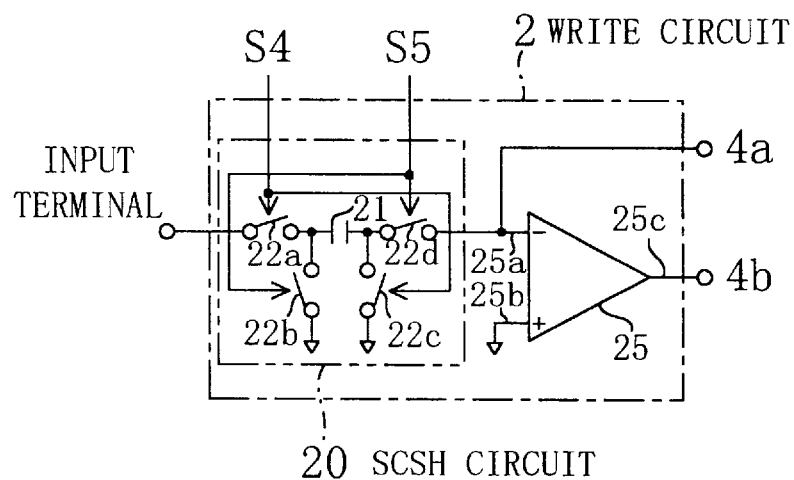
FIGS. 3(a) and 3(b) are diagrams for showing exemplified configurations of a write circuit and a read circuit, respectively.
Figure 3B:
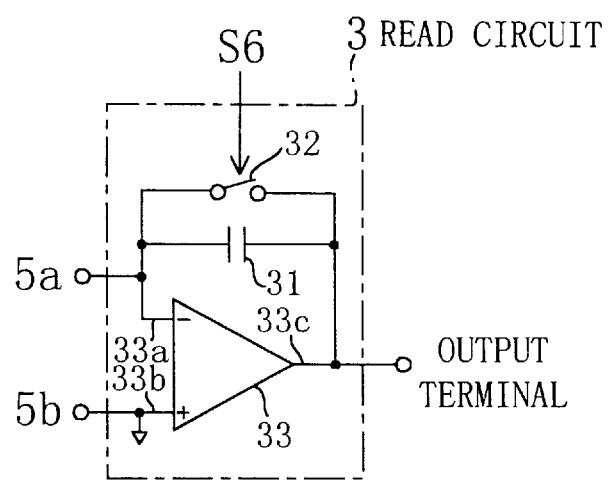

FIG. 3(a) is a diagram for showing an exemplified configuration of the write circuit 2, and FIG. 3(b) is a diagram for showing an exemplified configuration of the read circuit 3. The write circuit 2 comprises, as is shown in FIG. 3(a), a switched capacitor sample and hold (SCSH) circuit 20 and an operational amplifier 25. The SCSH circuit 20 includes a capacitance device 21 for once storing an input signal in the form of a charge, and switches 22a, 22b, 22c and 22d. The switches 22a and 22c are controlled to be turned on/off in accordance with a first write switch driving signal S4, and the switches 22b and 22d are controlled to be turned on/off in accordance with a second write switch driving signal S5. The read circuit 3 comprises, as is shown in FIG. 3(b), a capacitance device 31 for once storing an output signal in the form of a charge, a switch 32 and an operational amplifier 33. The switch 32 is controlled to be turned on/off in accordance with a read switch driving signal S6.

The rest operation, the read operation and the write operation of the analog FIFO memory of this embodiment will now be described with reference to FIGS. 4 through 6.

Figure 6:
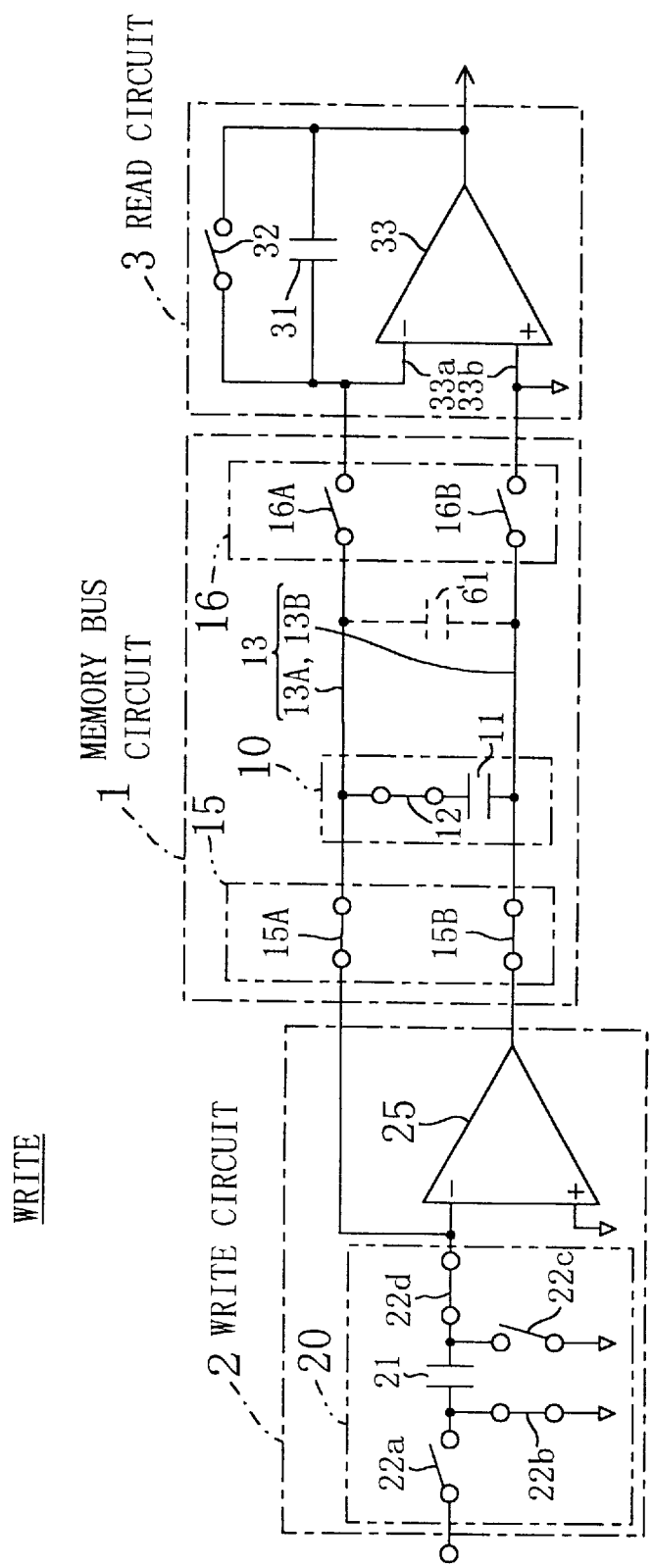
FIG. 6 is a diagram for showing the configuration of the analog FIFO memory of the first embodiment in a state for a write operation.

FIGS. 4 through 6 are diagrams for showing the configuration of the analog FIFO memory of this embodiment, wherein the circuit configurations shown in FIGS. 2 and 3 are adopted in the configuration outline of FIG. 1(a). FIG. 4 shows a state for the reset operation, FIG. 5 shows a state for the read operation, and FIG. 6 shows a state for the write operation. In these drawings, a reference numeral 61 denotes a parasitic capacitance of the memory bus 13, i.e., an intra-line capacitance between the first and second bus lines 13A and 13B. In FIGS. 4 through 6, merely one memory cell 10 is shown and the control means and signals for controlling the respective switches are omitted for the sake of simplification.

In the reset operation of this embodiment, the first and second bus lines 13A and 13B are set at a predetermined potential (for example, an analog ground potential), and the charge amount in the capacitance device 31 connected with the operational amplifier 33 in parallel in the read circuit 3 is made 0 (zero). Through such a reset operation, the first and second bus lines 13A and 13B attain the same potential, and hence, the charge amount stored in the intra-line capacitance 61 between the first and second bus lines 13A and 13B is made 0 (zero). Furthermore, since the first and second bus lines 13A and 13B have the same potential at the beginning of both the read operation and the write operation, a charge can be read from the memory cell 10 without being affected by the intra-line capacitance 61 between the first and second bus lines 13A and 13B.

In the reset operation of this embodiment, the read circuit 3 is utilized. Specifically, as is shown in FIG. 4, in the reset operation, the switches 15A and 15B of the input means 15 of the memory bus circuit 1 are turned off and the switches 16A and 16B of the output means 16 are turned on, and the switches 12 of all the memory cells 10 connected with the memory bus 13 are turned off. Furthermore, the switch 32 of the read circuit 3 is turned on. Thus, two input terminals 33a and 33b of the operational amplifier 33 of the read circuit 3 have the same potential. As a result, the first and second bus lines 13A and 13B of the memory bus circuit 1, which are connected with the two input terminals 33a and 33b of the operational amplifier 33 of the read circuit 3 through the output means 16, attain the same potential. Accordingly, the charge stored in the intra-line capacitance 61 is discharged to be 0 (zero). In this manner, the reset operation of the analog FIFO memory of this embodiment is completed.

Subsequently to the reset operation, the read operation is carried out. In the read operation, as is shown in FIG. 5, the switch 32 of the read circuit 3 is turned off, thereby releasing the reset state of the operational amplifier 33. Then, the switch 12 of the memory cell 10 is turned on, and the charge stored in the capacitance device 11 of the memory cell 10 is transferred to the capacitance device 31 of the read circuit 3. After completing the transfer, the first and second bus lines 13A and 13B of the memory bus circuit 1 attain the same potential again. In this manner, the read operation is completed.

Also, in the reset operation and the read operation, the switches 22a and 22c are turned on and the switches 22b and 22d are turned off in the SCSH circuit 20 of the write circuit 2. Thus, an input analog signal is stored in the capacitance device 21 of the SCSH circuit 20 in the form of a charge.

Subsequently to the read operation, the write operation is carried out. In the write operation, as is shown in FIG. 6, the switches 15A and 15B of the input means 15 of the memory bus circuit 1 are turned on, and the switches 16A and 16B of the output means 16 are turned off. In SCSH circuit 20 of the write circuit 2, the switches 22b and 22d are turned on and the switches 22a and 22c are turned off. Thus, the charge stored in the capacitance device 21 of the SCSH circuit 20 is transferred to the capacitance device 11 of the memory cell 10 by the operational amplifier 25 of the write circuit 2.

(Modification of Embodiment 1)

Figure 7:
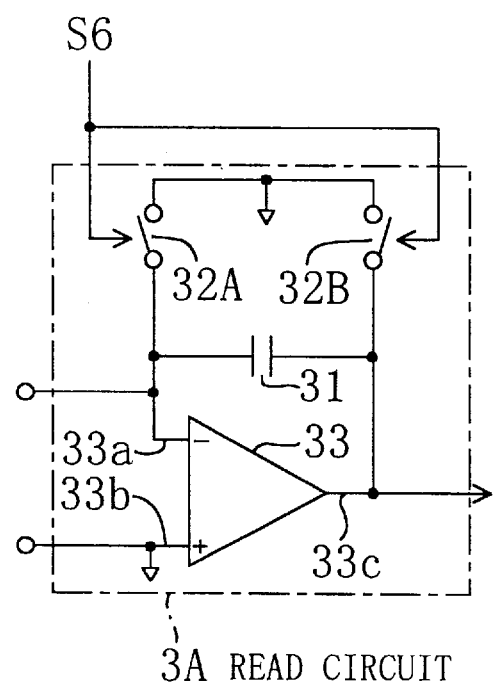
FIG. 7 is a diagram for showing the configuration of a read circuit according to a modification of the first embodiment.

FIG. 7 is a diagram for showing the configuration of a modified read circuit 3A replaceable with the read circuit 3 of the analog FIFO memory shown in FIG. 3(b). In the read circuit 3A according to this modification shown in FIG. 7, the switch 32 of the read circuit 3 of the original analog FIFO memory is replaced with first and second switches 32A and 32B for controlling connection between a negative-phase input terminal 33a and an output terminal 33c of an operational amplifier 33 and an analog ground potential power supply. The first and second switches 32A and 32B are controlled in accordance with the read switch driving signal S6.

In the read circuit 3 of FIG. 3(b), the switch 32 works to shortcut between the negative-phase input terminal 33a and the output terminal 33c of the operational amplifier 33 and set the potentials of the negative-phase input terminal 33a and the output terminal 33c at the analog ground potential, thereby decreasing a charge at the capacitance device 31 to be 0. However, when the negative-phase input terminal 33a and the output terminal 33c are shortcut, the read circuit 3 can be unstabilized and oscillated.

In the operational amplifier 33 having a feedback by using the capacitance device 31 as is shown in FIG. 3(b), when the charge of the capacitance device 31 at the end connected with the negative-phase input terminal 33a is fixed, the charge at the capacitance device 31 cannot move, and hence, the operational amplifier 33 can be stabilized. This means that the operational amplifier 33 is unconditionally stabilized. In other words, in a circuit like the SCSH circuit 20 where a charge is transferred to a capacitance connected in parallel between the negative-phase input terminal 25a and the output terminal 25c of the operational amplifier 25, the circuit is always stabilized after the transfer of the charge and cannot be oscillated.

Specifically, it is when the switch 32 is in an on-state that the read circuit 3 of FIG. 3(b) is unstabilized, namely, is oscillated.

Therefore, in the read circuit 3A according to this modification shown in FIG. 7, the negative-phase input terminal 33a and the output terminal 33c are directly connected with the analog ground power supply when the negative-phase input terminal 33a and the output terminal 33c are shortcut.

Thus, these terminals are forcibly made to have the analog ground potential.

Specifically, in the read circuit 3A of FIG. 7, when the negative-phase input terminal 33a and the output terminal 33c of the operational amplifier 33 are shortcut, the first and second switches 32A and 32B are both turned on, so that the negative-phase input terminal 33a and the output terminal 33c can attain the analog ground potential. Thus, the circuit can be reset. In this manner, the potentials of the negative-phase input terminal 33a and the output terminal 33c of the operational amplifier 33 can be forcibly fixed at the analog ground potential when these terminals are shortcut. As a result, the read circuit 3A can attain stability that it cannot be oscillated under any condition.

It is noted that the first embodiment of the invention is easily applicable to an analog FIFO memory comprising a plurality of memory bus circuits 1 each including plural memory cells 10.

Figure 8:
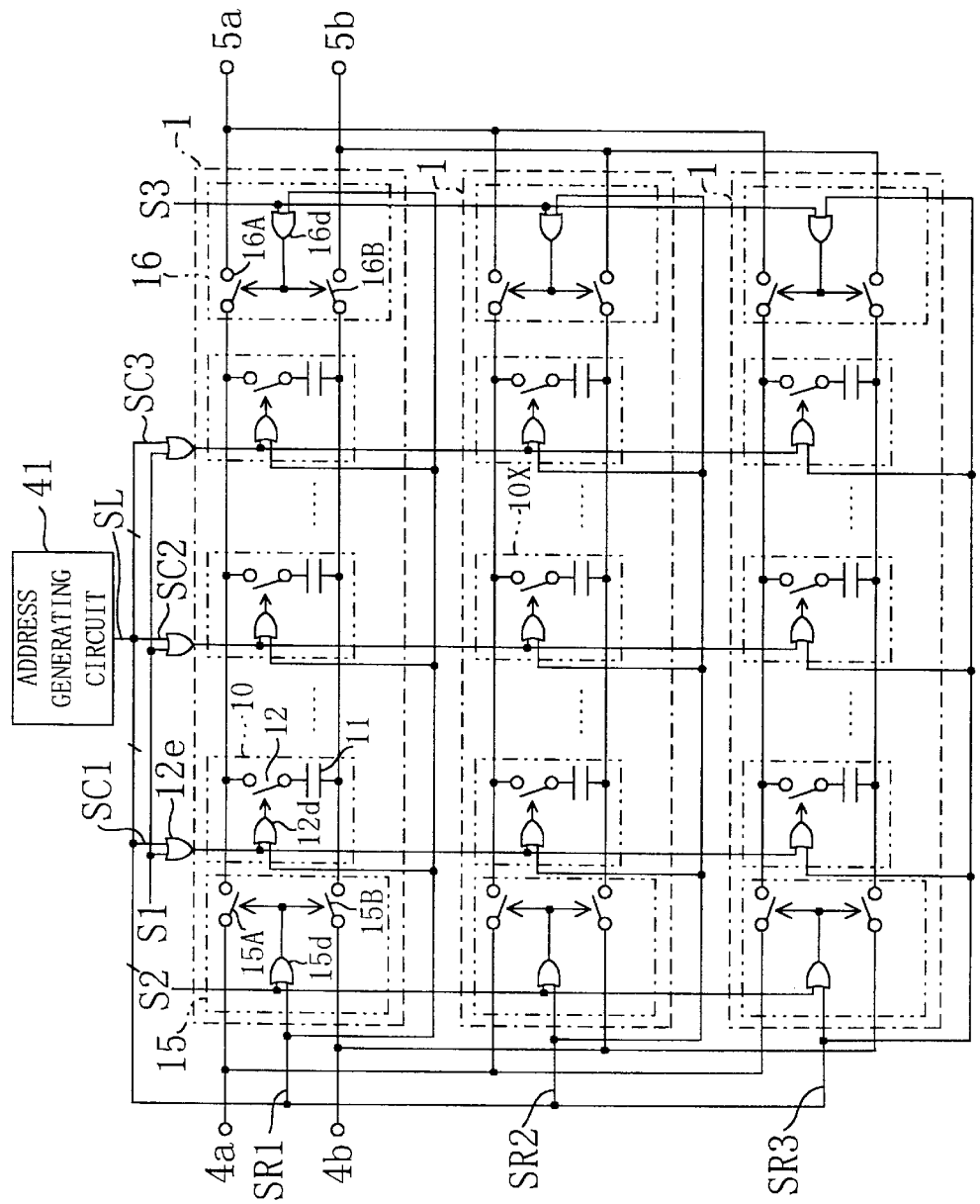
FIG. 8 is a diagram for showing the circuit configuration of the analog FIFO memory of the first embodiment provided with a plurality of memory bus circuits.

FIG. 8 is a diagram for showing an exemplified circuit configuration of an analog FIFO memory comprising a plurality of memory bus circuits, wherein the plural memory bus circuits 1 are disposed in parallel between the write circuit 2 and the read circuit 3. In FIG. 8, merely terminals 4a and 4b of the write circuit 2 and terminals 5a and 5b of the read circuit 3 are shown, and the write circuit 2 and the read circuit 3 are omitted.

In FIG. 8, a reference numeral 41 denotes an address generating circuit for outputting a memory selecting signal SL. The memory selecting signal SL is classified into row address selecting signals SR1 through SR3 and column address selecting signals SC1 through SC3. Since all of these signals are assumed to be low-active in this description, the switch control means 15c of the input means 15 is realized by an OR gate 15d, and the switch control means 16c of the output means 16 is realized by an OR gate 16d. Specifically, in the input means 15, when the row address selecting signals SR1 through SR3 and the input switch driving signal S2 are all at a low level, the switches 15A and 15B are in an on-state. In the output means 16, when the row address selecting signals SR1 through SR3 and the output switch driving signal S3 are all at a low level, the switches 16A and 16B are in an on-state. In other words, in merely the memory bus circuit 1 selected in accordance with the row address selecting signals SR1 through SR3, the switches 15A and 15B of the input means 15 and the switches 16A and 16B of the output means 16 are turned on.

Now, a method of driving the switch 12 of the memory cell 10 will be described. The switch 12 of the memory cell 10 is driven by a logical OR signal among one of the row address selecting signals SR1 through SR3, one of the column address selecting signals SC1 through SC3 and the memory cell switch driving signal S1, generated by OR gates 12d and 12e. Accordingly, in merely the memory cell 10 selected in accordance with the row address selecting signal and the column address selecting signal, the memory cell switch driving signal S1 can be transferred to the switch 12. For example, in FIG. 8, when the row address selecting signal SR2 and the column address selecting signal SC2 are at a low level, the memory cell switch driving signal S1 can be transferred to the switch 12 in a memory cell 10x alone. In this manner, the memory bus circuits 1 and the memory cells 10 can be freely selected in accordance with the row address selecting signals and the column address selecting signals, and hence, an analog signal can be written in and read from an arbitrary memory cell 10.

Figure 9:
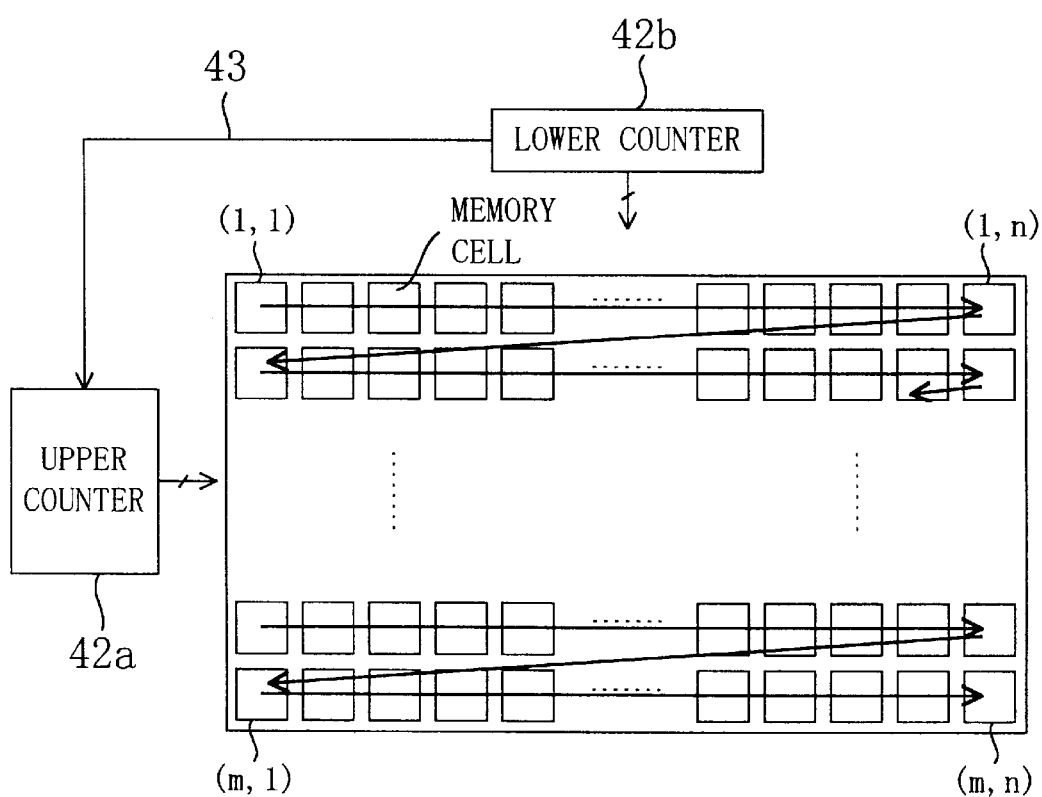
FIG. 9 is a diagram for illustrating a specific addressing method adopted in an analog FIFO memory including memory cells in m rows and n columns.

FIG. 9 is a diagram for illustrating a specific addressing method in an analog FIFO memory, wherein the analog FIFO memory includes memory cells in m rows and n columns. In FIG. 9, a reference numeral 42a denotes an m-ary counter, i.e., an upper counter, for specifying high order bits of a memory address, and a reference numeral 42b denotes an n-ary counter, i.e., a lower counter, for specifying low order bits of a memory address. The upper counter 42a and the lower counter 42b together form the address generating circuit. The lower counter 42b carries out an increment operation in accordance with an externally supplied clock. Also, a reference numeral 43 denotes a size error signal of the lower counter 42b, and the upper counter 42a carries out an increment operation in accordance with the size error signal 43.

Specifically, the memory address is successively changed from (1, 1) to (1, 2), (1, 3), etc. as a result of the increment operation of the lower counter 42b, and when the memory address becomes (1, n), the lower counter 42b outputs the size error signal 43. In response to the size error signal 43, the upper counter 42a carries out the increment operation, so that (2, 1) can be specified as the memory address. Similarly, the memory address is specified as up to (m, n), and thereafter, the memory address returns to (1, 1). Therefore, when the cycle of the clock supplied to the lower counter 42b is indicated as T, an analog signal written in each memory cell is read after (m * n * T).

The memory address is switched in this embodiment after writing a signal in a memory cell as is shown in FIG. 1(b). Specifically, after an input analog signal is written in a memory cell, a subsequent memory cell is accessed, and the analog signal is read after the reset operation. At this point, this memory cell stores the analog signal written (m * n * T) ago as described above. Accordingly, through the addressing method as shown in FIG. 9, this circuit works as the analog FIFO memory having a delay time of (m * n * T).

(Embodiment 2)

Figure 10:
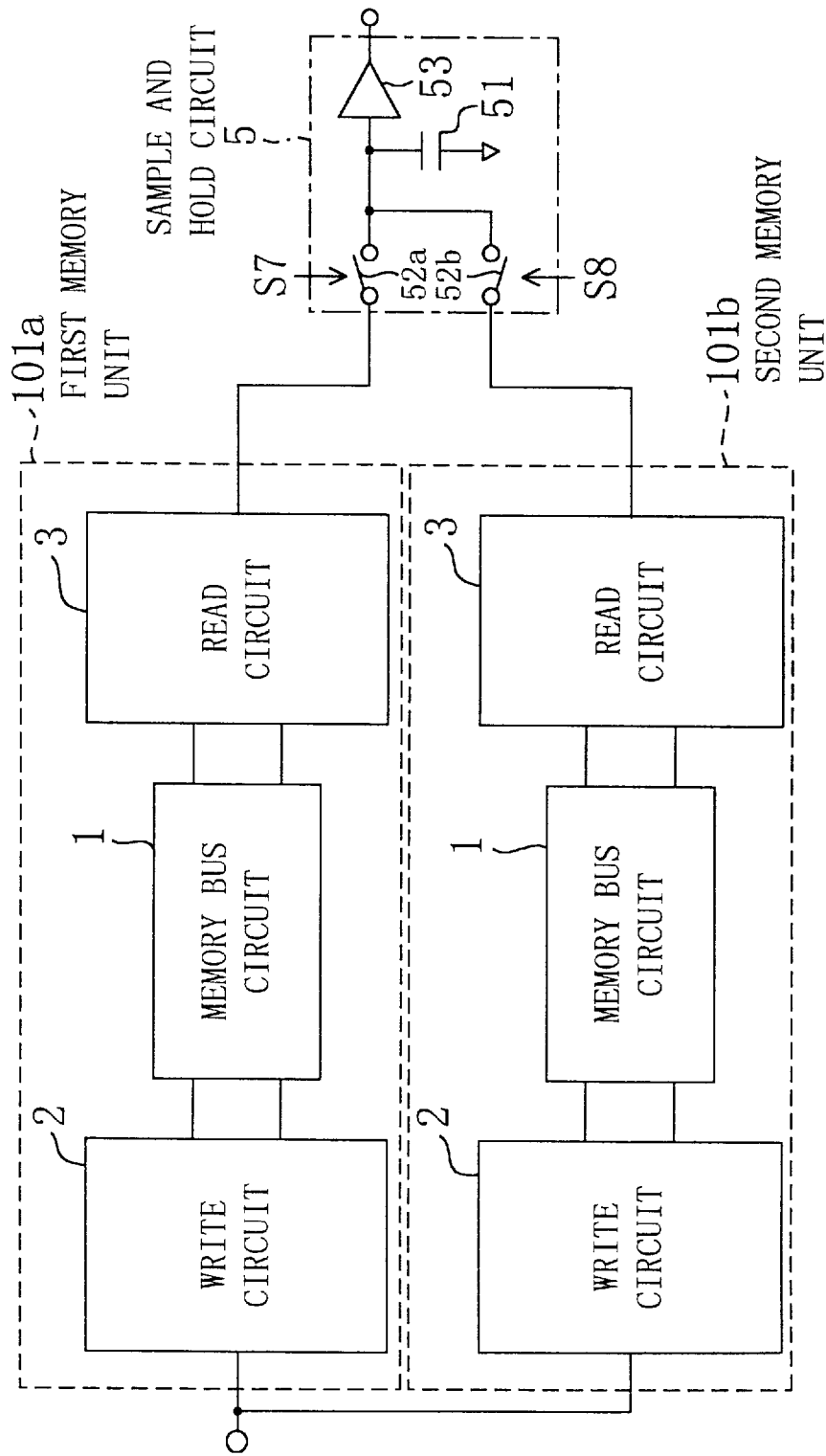
FIG. 10 is a diagram for showing the outline of the configuration of an analog FIFO memory according to a second embodiment of the invention.

FIG. 10 is a diagram for showing the outline of the configuration of an analog FIFO memory according to a second embodiment of the invention. As is shown in FIG. 10, the analog FIFO memory of this embodiment comprises first and second memory units 101a and 101b having the same configuration. Each of the first and second memory units 101a and 101b includes a memory bus circuit 1 having a memory bus connected with a memory cell for storing an analog signal, a write circuit 2 for writing the analog signal in the memory cell through the memory bus, and a read circuit 3 for reading the analog signal from the memory cell through the memory bus.

Furthermore, a reference numeral 5 denotes a sample and hold circuit for sampling and holding the analog signal output by the first and second memory units 101a and 101b, a reference numeral 51 denotes a capacitance device for storing the analog signal output by the first and second memory units 101a and 101b in the form of a charge, a reference numeral 52a denotes a switch for controlling connection between the first memory unit 101a and the capacitance device 51, a reference numeral 52b denotes a switch for controlling connection between the second memory unit 101b and the capacitance device 51, and a reference numeral 53 denotes a buffer amplifier. The switch 52a is controlled in accordance with a first sample and hold switch driving signal S7, and the switch 52b is controlled in accordance with a second sample and hold switch driving signal S8.

Figure 11:
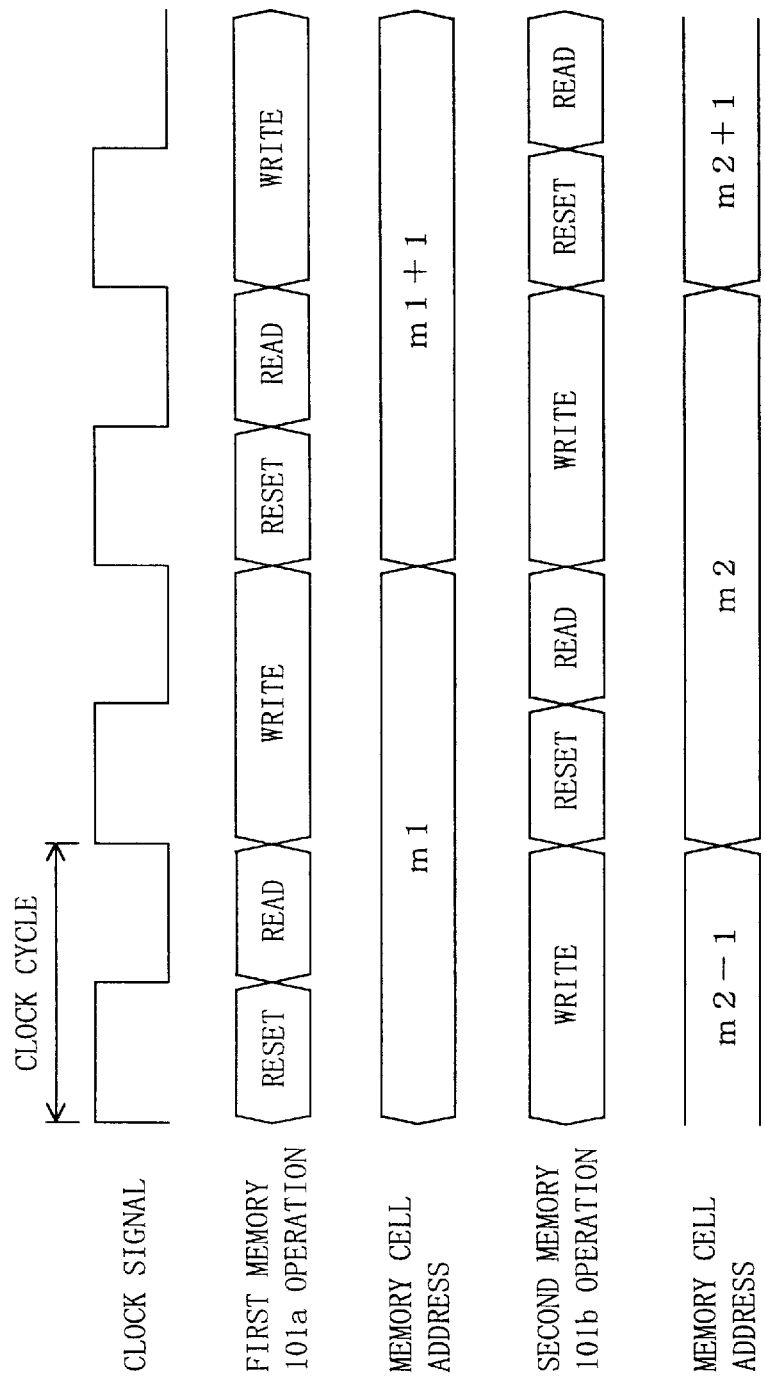
FIG. 11 is a diagram for showing the outline of the operation of the analog FIFO memory of the second embodiment.

FIG. 11 is a diagram for showing the outline of the operation of the analog FIFO memory of this embodiment shown in FIG. 10. As is shown in FIG. 11, in the analog FIFO memory of this embodiment, both the first and second memory units 101a and 101b repeatedly carry out the reset operation, the read operation and the write operation in the same manner as described in the first embodiment. The first and second memory units 101a and 101b are operated in parallel, and in synchronization with a clock signal, one of them carries out the write operation while the other is carrying out the reset operation and the read operation. As a result, an analog signal can be input/output in each clock cycle.

As is shown in FIGS. 10 and 11, the analog FIFO memory of this embodiment is divided into the two memory units 101a and 101b having the same configuration, so as to be operated in parallel. Such a parallel configuration is very effective, for example, in application for delaying a TV signal, which will now be described in detail.

Figure 29:
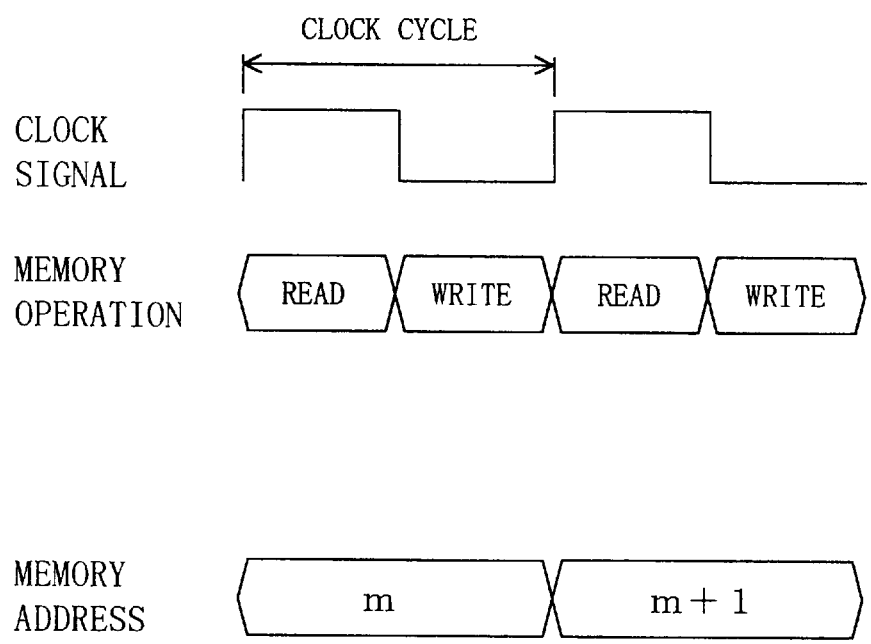
FIG. 29 is a diagram for showing the outline of the operation of the conventional analog FIFO memory.

FIG. 29 is a diagram for showing the outline of the operation of a conventional analog FIFO memory. In the conventional analog FIFO memory, as is shown in FIG. 29, an analog signal is read and written in every clock cycle. In other words, time allocatable to each read/write operation is a half of the clock cycle. In general, when an NTSC color signal is delayed by using an analog FIFO memory, the clock cycle is approximately 70 ns. Therefore, the time allocatable to each read/write operation is approximately 35 ns. In order to read/write an analog signal within this time, the analog FIFO memory is required to be operated at a very high speed. In addition, it is practically impossible to conduct another operation such as the reset operation apart from the read/write operation within this time.

In the analog FIFO memory of this embodiment, the two memory units 101a and 101b disposed in parallel conduct the read operation and the write operation in parallel, and hence, time twice as long as the conventional time can be allocated to each read/write operation. Accordingly, it is possible to attain spare time for conducting the reset operation prior to the read operation. As a result, in the application for, for example, delaying a TV signal, the reset operation can be carried out before the read operation.

The specific operation of the analog FIFO memory of this embodiment will now be described in detail with reference to FIGS. 12 through 17.

Figure 12:
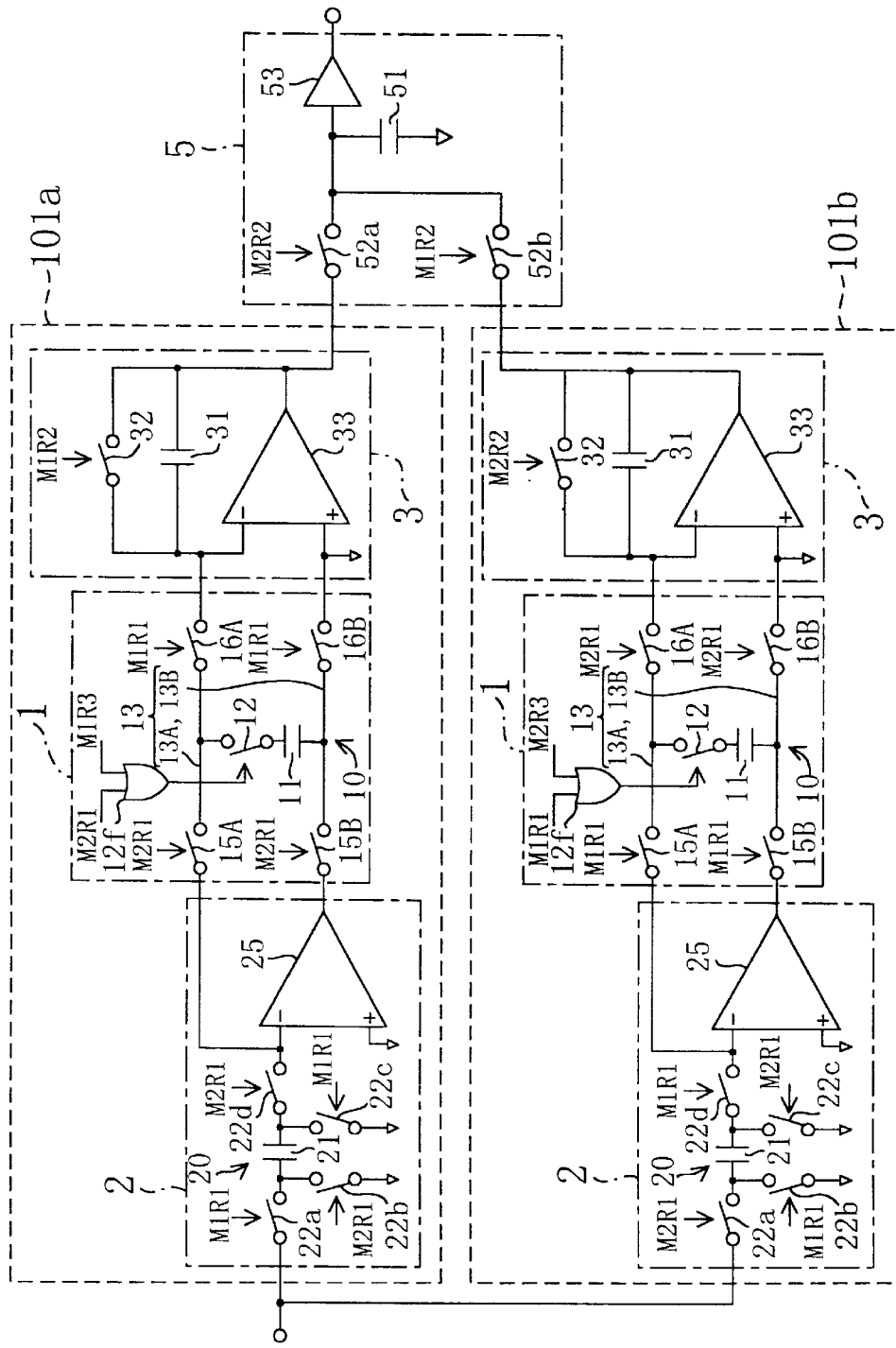
FIG. 12 is a diagram for showing the configuration of the analog FIFO memory of the second embodiment and respective control signals for controlling switches therein.

FIG. 12 is a circuit diagram of the analog FIFO memory of this embodiment, wherein the circuit configurations shown in FIGS. 2 and 3 are adopted in the configuration outline of FIG. 10. In FIG. 12, control signals for controlling respective switches are also shown. For the sake of simplification, merely one memory cell 10 is shown in each of the first and second memory units 101a and 101b.

As is shown in FIG. 12, a control signal M1R1 is supplied not only as the first write switch driving signal S4 for the write circuit 2 and the output switch driving signal S3 for the memory cell circuit 1 in the first memory unit 101a, but also as the second write switch driving signal S5 for the write circuit 2 and the input switch driving signal S2 for the memory bus circuit 1 in the second memory unit 101b. Specifically, the switches 22a and 22c of the write circuit 2 and the switches 16A and 16B of the memory cell circuit 1 are controlled in accordance with the control signal M1R1 in the first memory unit 101a, and the switches 22b and 22d of the write circuit 2 and the switches 15A and 15B of the memory cell circuit 1 are controlled in accordance with the control signal M1R1 in the second memory unit 101b.

A control signal M2R1 is supplied not only as the second write switch driving signal S5 for the write circuit 2 and the input switch driving signal S2 for the memory cell circuit 1 in the first memory unit 101a, but also as the first write switch driving signal S4 for the write circuit 2 and the output switch driving signal S3 for the memory cell circuit 1 in the second memory unit 101b. Specifically, the switches 22b and 22d of the write circuit 2 and the switches 15A and 15B of the memory cell circuit 1 are controlled in accordance with the control signal M2R1 in the first memory unit 101a, and the switches 22a and 22c of the write circuit 2 and the switches 16A and 16B of the memory cell circuit 1 are controlled in accordance with the control signal M2R1 in the second memory unit 101b.

Furthermore, a control signal M1R2 is supplied as the read switch driving signal S6 for the read circuit 3 and the second sample and hold switch driving signal S8 for the sample and hold circuit 5 in the first memory unit 101a. Specifically, the switch 32 of the read circuit 3 and the switch 52b of the sample and hold circuit 5 are controlled in accordance with the control signal M1R2 in the first memory unit 101a.

A control signal M2R2 is supplied as the read switch driving signal S6 for the read circuit 3 and the first sample and hold switch driving signal S7 for the sample and hold circuit 5 in the second memory unit 101b. Specifically, the switch 32 of the read circuit 3 and the switch 52a of the sample and hold circuit 5 are controlled in accordance with the control signal M2R2 in the second memory unit 101b.

Moreover, a control signal M1R3 is supplied as the memory cell switch driving signal S1 for the memory bus circuit 1, and is input to an OR gate 12f together with the control signal M2R1 in the first memory unit 101a. The switch 12 of the memory cell 10 of the memory bus circuit 1 in the first memory unit 101a is controlled in accordance with a logical OR signal between the control signals M1R3 and M2R1. A control signal M2R3 is supplied as the memory cell switch driving signal S1 for the memory bus circuit 1, and is input to an OR gate 12f together with the control signal M1R1 in the second memory unit 101b. The switch 12 of the memory cell 10 of the memory bus circuit 1 in the second memory unit 101b is controlled in accordance with a logical OR signal between the control signals M2R3 and M1R1.

Figure 13:
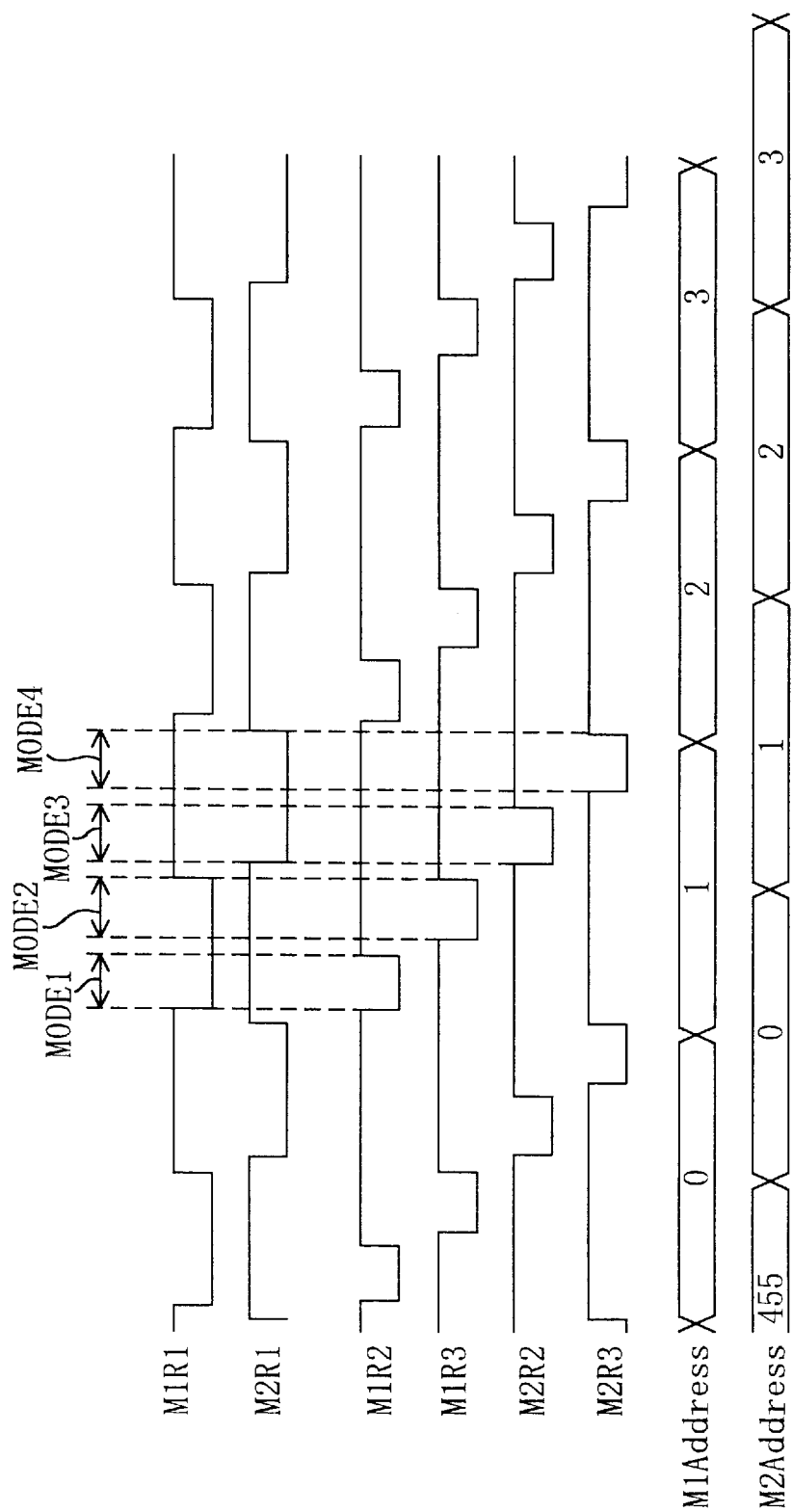
FIG. 13 is a diagram for showing variation with time of the respective control signals for controlling the analog FIFO memory of the second embodiment shown in FIG. 12.

FIG. 13 shows variation with time of the respective control signals for controlling the analog FIFO memory of FIG. 12. In FIG. 13, all the control signals are assumed to be low-active, and "M1Address" indicates a memory address in the first memory unit 101a, and "M2Address" indicates a memory address in the second memory unit 101b.

As is shown in FIG. 13, the operation of the analog FIFO memory of FIG. 12 can be divided into four modes, i.e., MODE 1 through MODE 4, in accordance with the variation with time of the control signals. FIGS. 14 through 17 show states of the analog FIFO memory of FIG. 12 in MODE 1 through MODE 4, respectively. Now, the operation of the analog FIFO memory of FIG. 12 in the respective modes will be described with reference to FIGS. 14 through 17.

(MODE 1)

In MODE 1, the first memory unit 101a carries out the reset operation for the memory bus 13 prior to the read operation and samples an input analog signal, while the second memory unit 101b is carrying out the write operation.

Figure 14:
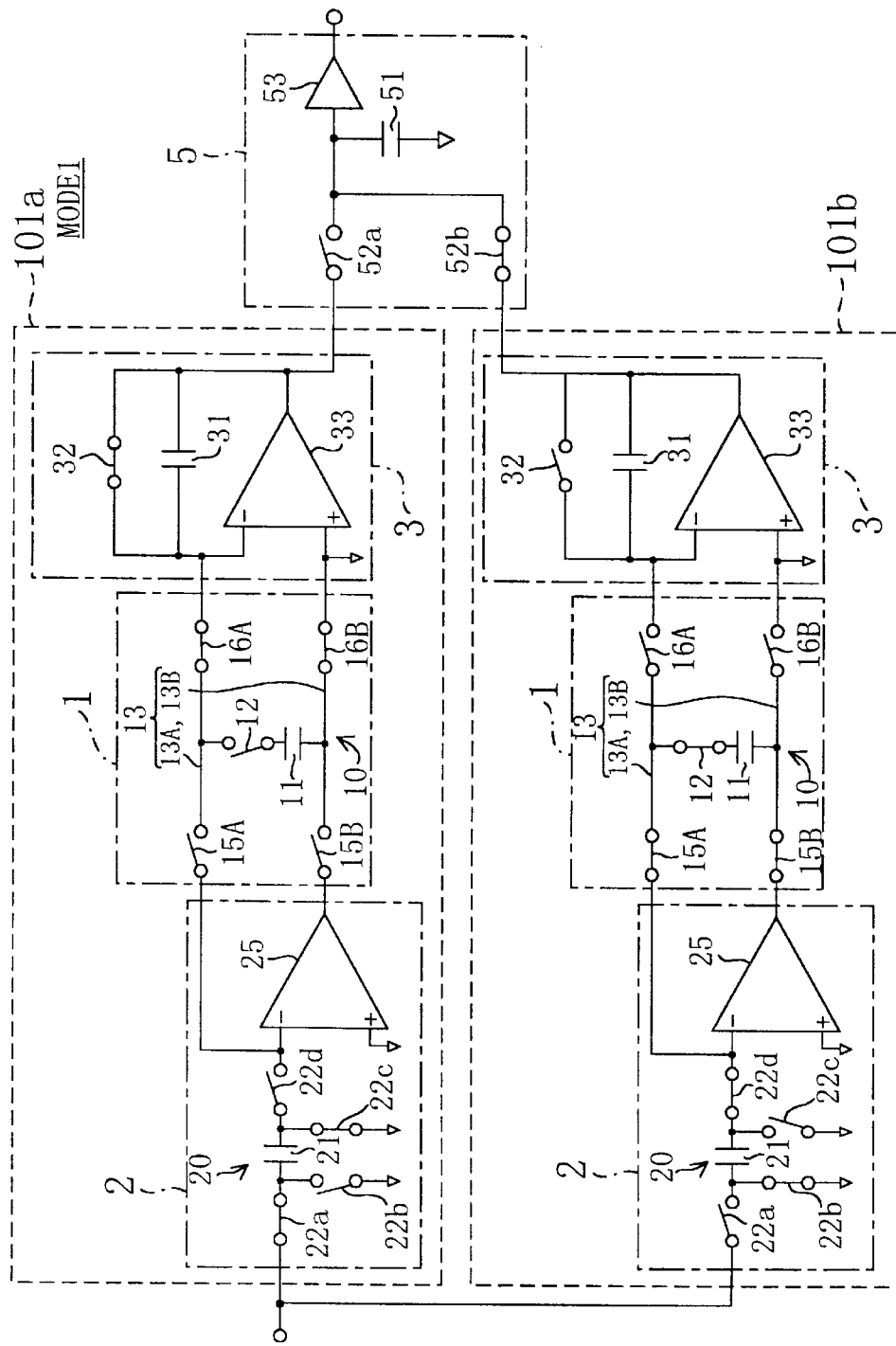
FIG. 14 is a diagram for showing a state in MODE 1 of the analog FIFO memory of the second embodiment shown in FIG. 12.

The read circuit 3 is used for resetting the memory bus 13. Specifically, as is shown in FIG. 14, in the first memory unit 101a, the switch 32 of the read circuit 3 is turned on and the switches 16A and 16B of the output means 16 are turned on. As a result, the first and second bus lines 13A and 13B are set at the analog ground potential, and the charge stored in the capacitance device 31 is made 0. At this point, the switch 12 of the memory cell 10 is in an off-state so that the capacitance device 11 cannot be reset. Simultaneously, the switches 22a and 22c of the SCSH circuit 20 are turned on, thereby sampling the input analog signal in the capacitance device 21.

On the other hand, in the second memory unit 101b, the switches 22b and 22d of the SCSH circuit 20 are turned on, and the switches 15A and 15B of the input means 15 are turned on. As a result, the charge in the capacitance device 21 is transferred to the capacitance device 11 of the memory cell 10 through the memory bus 13, namely, the write operation is carried out. Furthermore, at this point, the switch 52b of the sample and hold circuit 5 is turned on, thereby sampling an output signal of the read circuit 3 in the capacitance device 51 of the sample and hold circuit 5.
(MODE 2)

Figure 15:
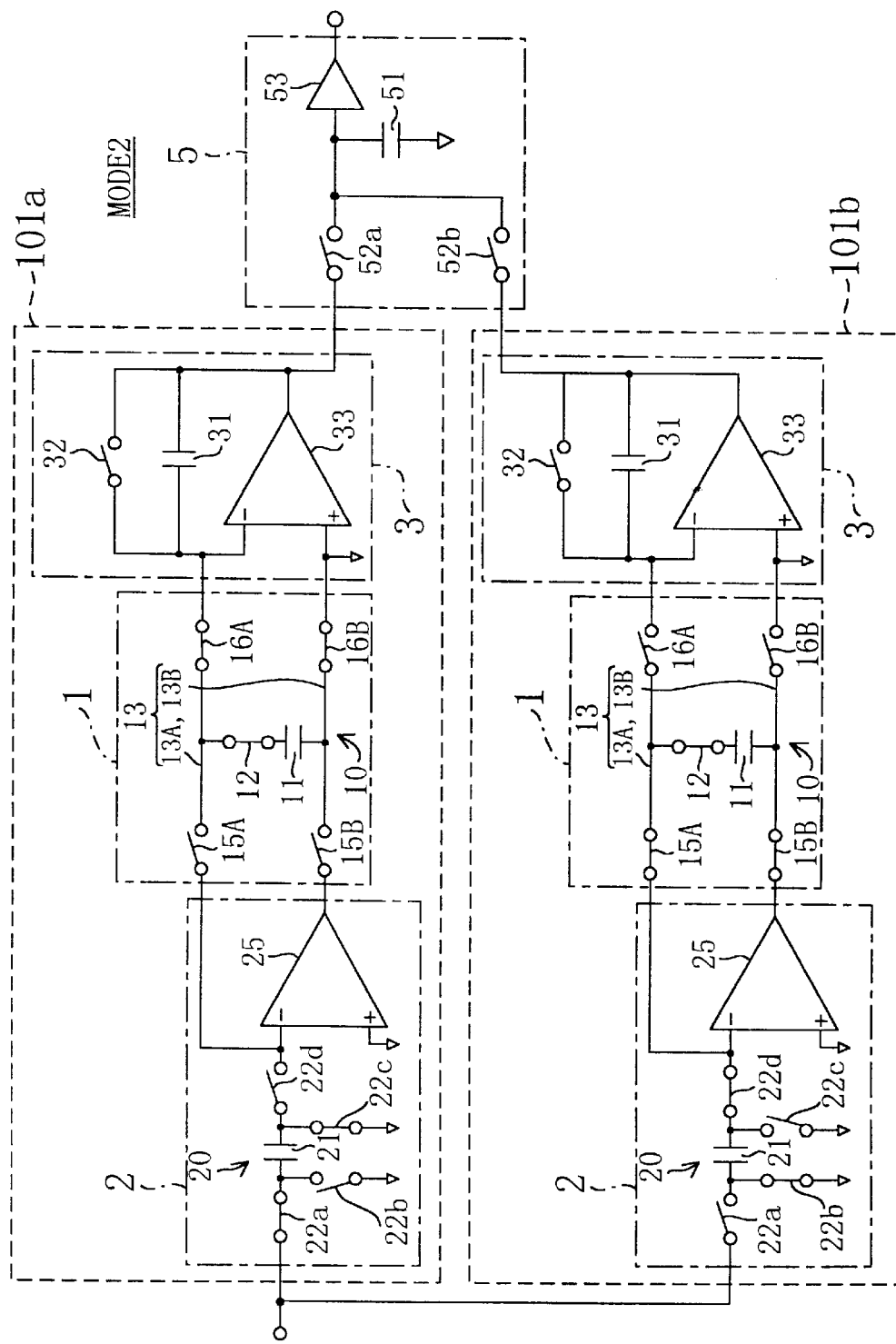
FIG. 15 is a diagram for showing a state in MODE 2 of the analog FIFO memory of the second embodiment shown in FIG. 12.

In MODE 2, the first memory unit 101a conducts the read operation. Specifically, as is shown in FIG. 15, in the first memory unit 101a, the switch 32 of the read circuit 3 is turned off, and the switch 12 of the memory cell 10 is turned on, thereby transferring the charge in the capacitance device 11 of the memory cell 10 to the capacitance device 31 of the read circuit 3 through the memory bus 13.

On the other hand, the second memory unit 101b continues to conduct the write operation, but the switch 52b of the sample and hold circuit 5 is turned off, thereby placing the sample and hold circuit 5 in a hold state.
(MODE 3 )

In MODE 3, contrary to MODE 1, the first memory unit 101a conducts the write operation while the second memory unit 101b is conducting the reset operation for the memory bus 13 prior to the read operation and sampling an input analog signal.

Figure 16:
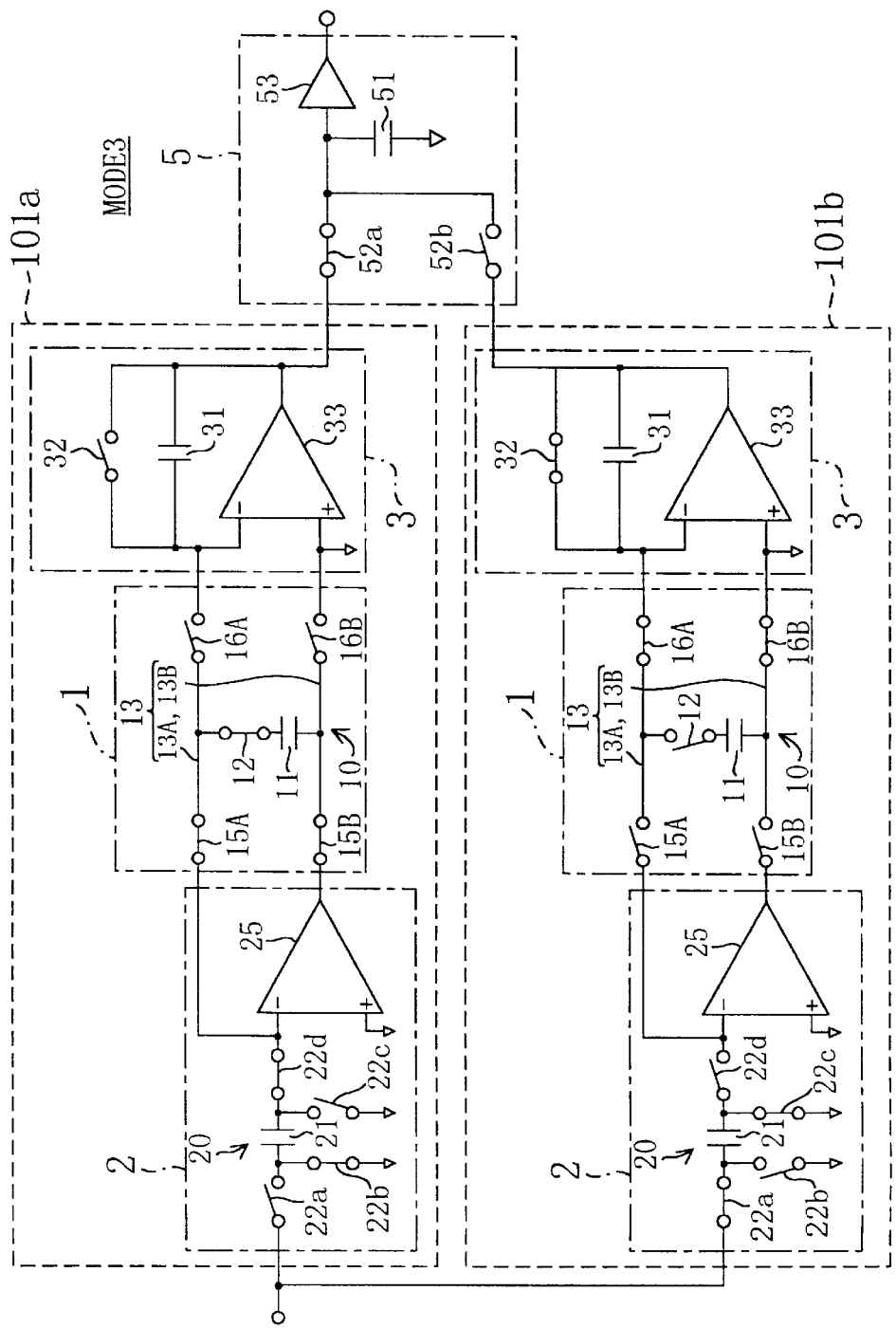
FIG. 16 is a diagram for showing a state in MODE 3 of the analog FIFO memory of the second embodiment shown in FIG. 12.

Specifically, as is shown in FIG. 16, in the first memory unit 101a, the switches 22b and 22d of the SCSH circuit 20 are turned on, and the switches 15A and 15B of the input means 15 are turned on, thereby transferring the charge in the capacitance device 21 of the write circuit 2 to the capacitance device 11 of the memory cell 10. Furthermore, at this point, the switch 52a of the sample and hold circuit 5 is turned on, thereby sampling an output analog signal of the read circuit 3 in the capacitance device 51 of the sample and hold circuit 5.

On the other hand, in the second memory unit 101b, the switch 32 of the read circuit 3 is turned on, and the switches 16A and 16B of the output means 16 are turned on, thereby resetting the memory bus 13 and the capacitance device 32 of the read circuit 3. Simultaneously, the switches 22a and 22c of the SCSH circuit 20 are turned on, thereby sampling an input analog signal in the capacitance device 21 of the write circuit 2.
(MODE 4 )

Figure 17:
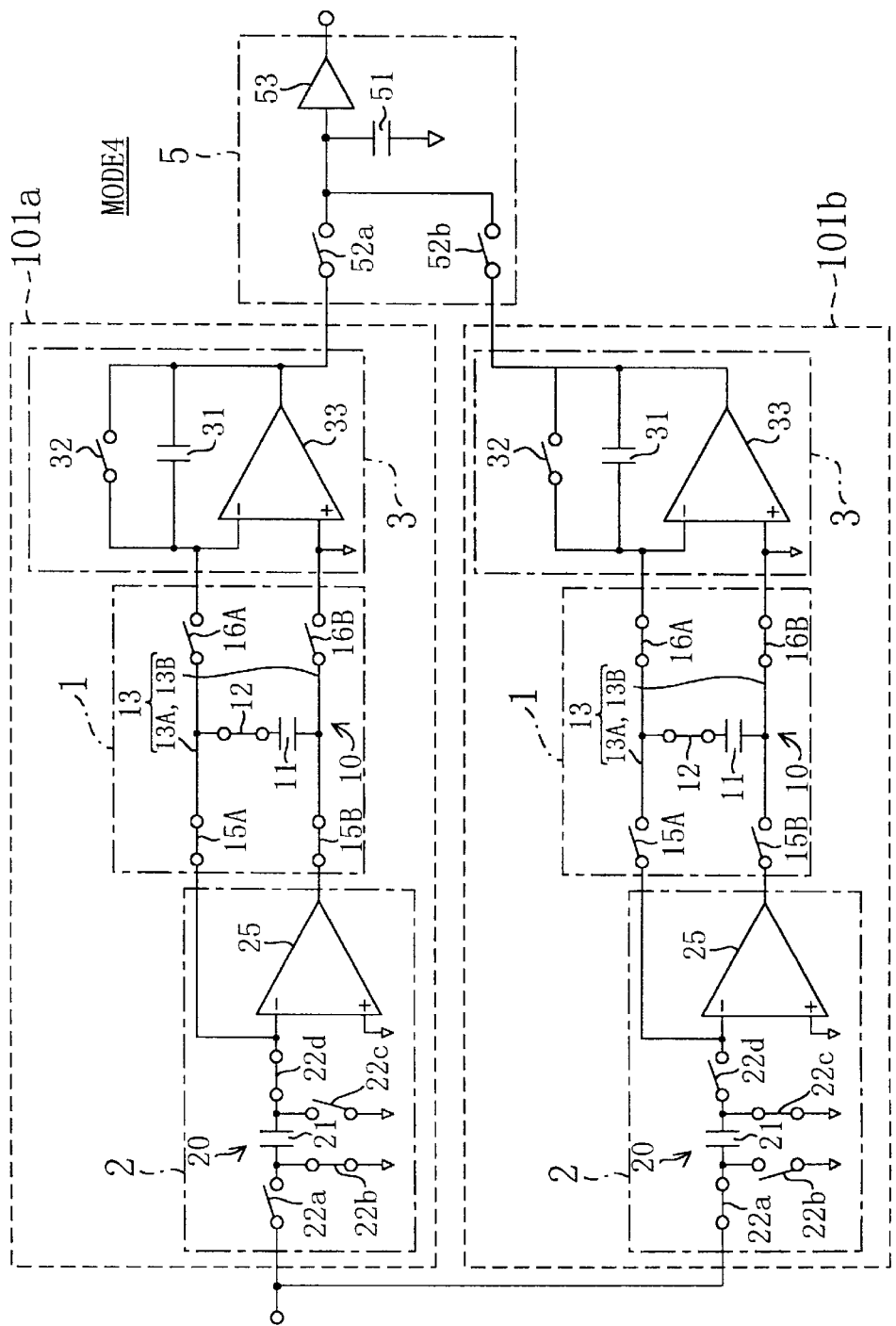
FIG. 17 is a diagram for showing a state in MODE 4 of the analog FIFO memory of the second embodiment shown in FIG. 12.

Ultimately in MODE 4, contrary to MODE 2, the second memory unit 101b conducts the read operation. Specifically, as is shown in FIG. 17, in the second memory unit 101b, the witch 32 of the read circuit 3 is turned off, and the switch 12 of the memory cell 10 is turned on, thereby transferring the charge stored in the capacitance device 11 of the memory cell 10 to the capacitance device 31 of the read circuit 3 through the memory bus 13. On the other hand, the first memory unit 101a continues to conduct the write operation, but the switch 52a is turned off, thereby placing the sample and hold circuit 5 in the hold state.

By repeating such operations in MODE 1 through MODE 4, the operation of the analog FIFO memory of this embodiment as is shown in FIG. 11 can be realized.

Alternatively, the first and second memory units 101a and 101b can be controlled in accordance with the respective control signals, so that one can carry out the read operation while the other is carrying out the write operation and the reset operation.

Furthermore, it is possible to provide three memory units each including the memory bus circuit 1 and to operate the three memory units in parallel. In such a case, for example, while one is carrying out the write operation, another carries out the read operation and the other carries out the reset operation.
(Embodiment 3)

Figure 18:
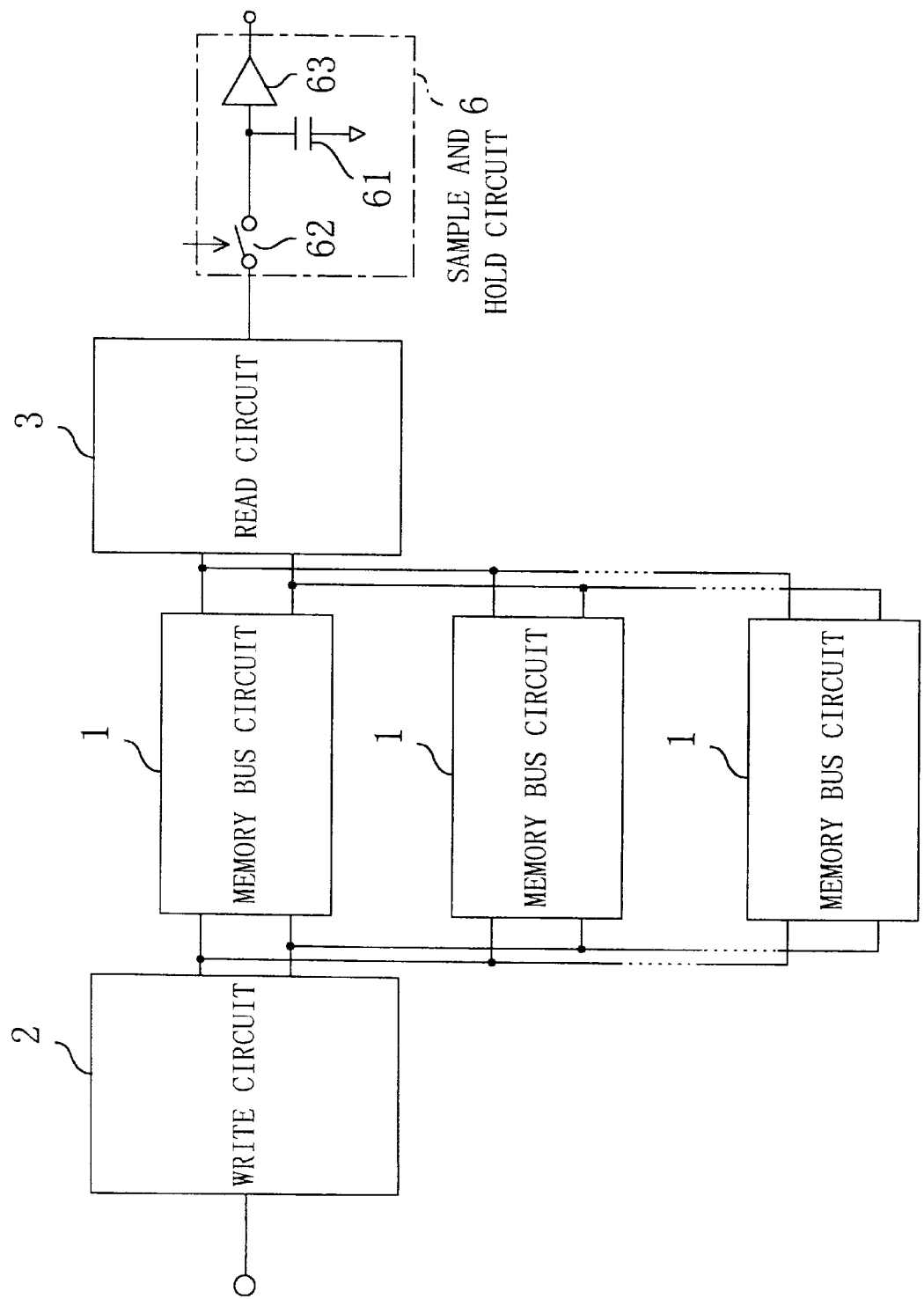
FIG. 18 is a diagram for showing the outline of the configuration of an analog FIFO memory according to a third embodiment of the invention.

FIG. 18 is a diagram for showing the outline of the configuration of an analog FIFO memory of a third embodiment of the invention. The analog FIFO memory of this embodiment comprises, as is shown in FIG. 18, a plurality of memory bus circuits 1 each including a memory bus connected with memory cells for storing an analog signal. Also in FIG. 18, a reference numeral 6 denotes a sample and hold circuit for sampling and holding an analog signal output by a read circuit 3, a reference numeral 61 denotes a capacitance device for storing the analog signal output by the read circuit 3 in the form of a charge, a reference numeral 62 denotes a switch for controlling connection between the read circuit 3 and the capacitance device 61, and a reference numeral 63 denotes a buffer amplifier.

Figure 19:
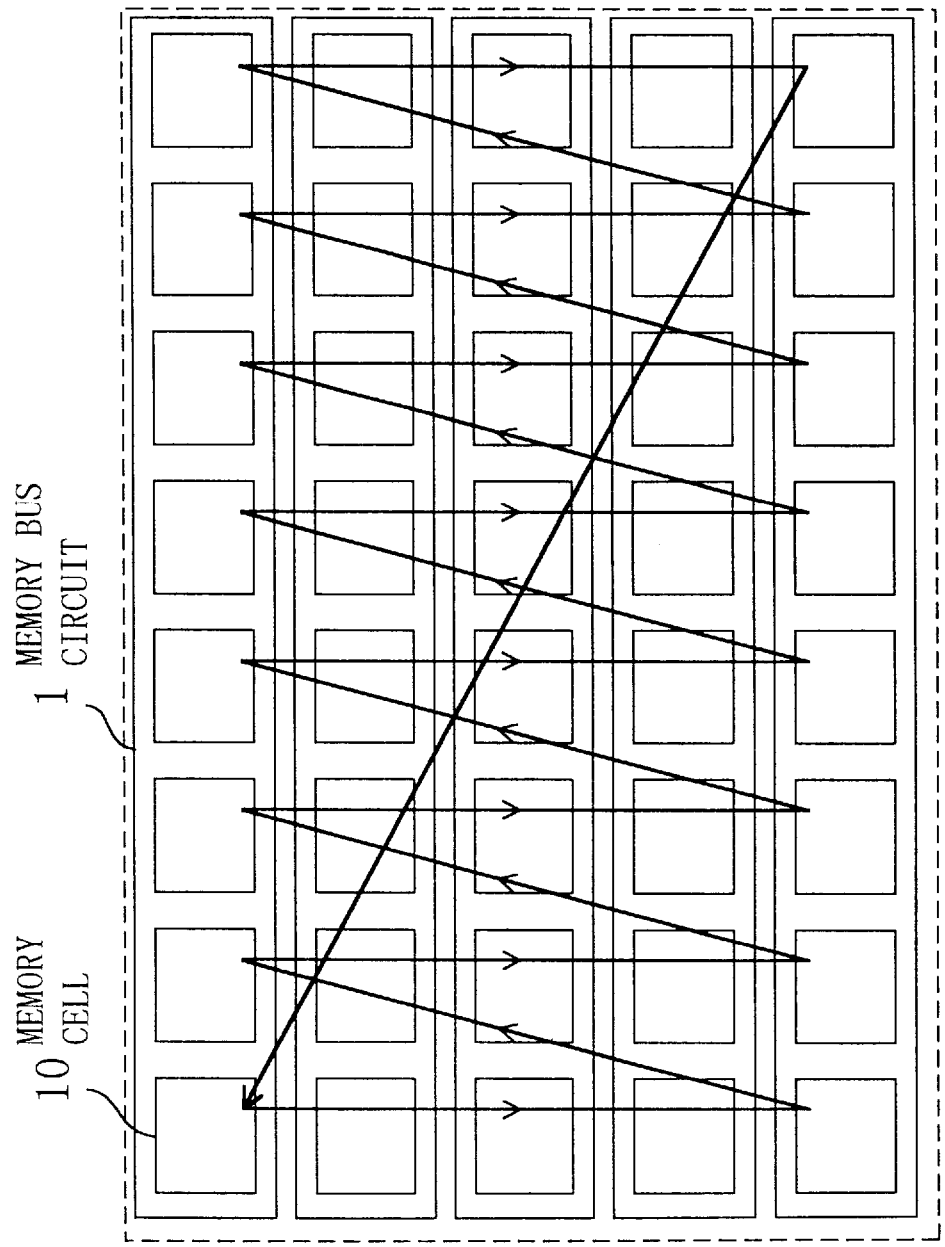
FIG. 19 is a diagram for illustrating an addressing method adopted in the analog FIFO memory of the third embodiment.

FIG. 19 shows addressing to the memory cells in the analog FIFO memory of this embodiment. This analog FIFO memory adopts, as is shown in FIG. 19, so-called vertical addressing wherein the memory cells aligned in the memory bus circuit 1 are accessed in an order along the vertical direction.

The analog FIFO memory of this embodiment conducts the reset operation prior to the read operation as that of the first embodiment. This embodiment is characterized by that the reset operation for the memory bus is carried out in parallel with the write operation. This characteristic will now be specifically described.

Assuming that a signal to be processed by the analog FIFO memory is a video signal, the analog FIFO memory has a sampling cycle of approximately 70 ns. Therefore, each of the reset operation for the memory bus and the read/write operation is required to be completed within 70 ns. This means that every operation is required to be completed within approximately 23 ns, and a GB production required of each operational amplifier used in the write circuit 2 and the read circuit 3 is as large as 1 GHz, which cannot be practically realized.

Accordingly, in this embodiment, the reset operation and the write operation are carried out in parallel, and the read operation is carried out thereafter. As a result, even when the analog FIFO memory is used for delaying a video signal, time of approximately 35 ns. can be allocated to each operation. Thus, the load on each operational amplifier in the write circuit 2 and the read circuit 3 can be decreased, resulting in decreasing power consumption.

In order to conduct the reset operation and the write operation in parallel, the memory bus is required to be reset at the same time as the write operation for writing an analog signal in a memory cell. However, the write operation and the reset operation cannot be conducted on the same memory bus as a matter of course. Therefore, the analog FIFO memory of this embodiment adopts the vertical addressing as is shown in FIG. 19, so that the write operation and the reset operation can be conducted in parallel. Due to this vertical addressing, an operation for writing an analog signal in one memory bus circuit 1 can be carried out in parallel with an operation for resetting another memory bus circuit 1.

Now, the operation of the analog FIFO memory of this embodiment will be described with reference to FIGS. 20(a) through 20(d). The analog FIFO memory shown in FIGS. 20(a) through 20(d) includes four memory bus circuits 1A, 1B, 1C and 1D, and switches therein are operated in an order successively shown in FIG. 20(a) through FIG. 20(d). Also in FIGS. 20(a) through 20(d), a switch in an on-state is encircled.

First, as is shown in FIG. 20(a), in the memory bus circuit 1A, the switches of the input means 15 are turned on and the switch of one memory cell 10 is turned on, so that an analog signal can be written in this memory cell 10 whose switch is in an on-state. In the memory bus circuit 1B, from which an analog signal is subsequently read, the switches of the output means 16 are turned on and the switch 32 of the read circuit 3 is turned on, and hence, the memory bus 13 is reset in the memory bus circuit 1B. In this manner, the write operation in the memory bus circuit 1A and the reset operation in the memory bus circuit 1B are carried out in parallel.

Then, as is shown in FIG. 20(b), the read operation is carried out in the memory bus circuit 1B. The switch 32 of the read circuit 3 is turned off and the switch of one memory cell 10 of the memory bus circuit 1B is turned on, so that an analog signal is read from the memory cell 10 whose switch is in an on-state.

Next, as is shown in FIG. 20(c), the write operation is conducted in the memory bus circuit 1B, in which the read operation has been completed. The switches of the input means 15 of the memory bus circuit 1B are turned on and the switch of one memory cell 10 of the memory bus circuit 1B is turned on, so that an analog signal is written in the memory cell 10 whose switch is in an on-state. Furthermore, the reset operation is conducted in the memory bus circuit 1C, from which an analog signal is subsequently read. In the memory bus circuit 1C, the switches of the output means 16 are turned on and the switch 32 of the read circuit 3 is turned on, and hence, the memory bus 13 of the memory bus circuit 1C is reset. In this manner, the write operation in the memory bus circuit 1B and the reset operation in the memory bus circuit 1C are carried out in parallel.

Subsequently, as is shown in FIG. 20(d), the read operation is carried out in the memory bus circuit 1C. The switch 32 of the read circuit 3 is turned off and the switch of one memory cell 10 of the memory bus circuit 1C is turned on, so that an analog signal can be read from the memory cell 10 whose switch is in an on-state.

As is obvious from FIGS. 20(a) through 20(d), in the analog FIFO memory of this embodiment, the memory cells are addressed in the order along the vertical direction, so that the write operation in one memory bus circuit can be carried out in parallel with the reset operation in another memory bus circuit in which the read operation is subsequently conducted. Technical concept of this embodiment allows the write operation and the reset operation to be conducted in parallel through the vertical addressing on the memory bus circuits. The operation time for each operation can be thus sufficiently secured, so as to reduce the operation speed of the operational amplifiers and their power consumption.

Figure 21:
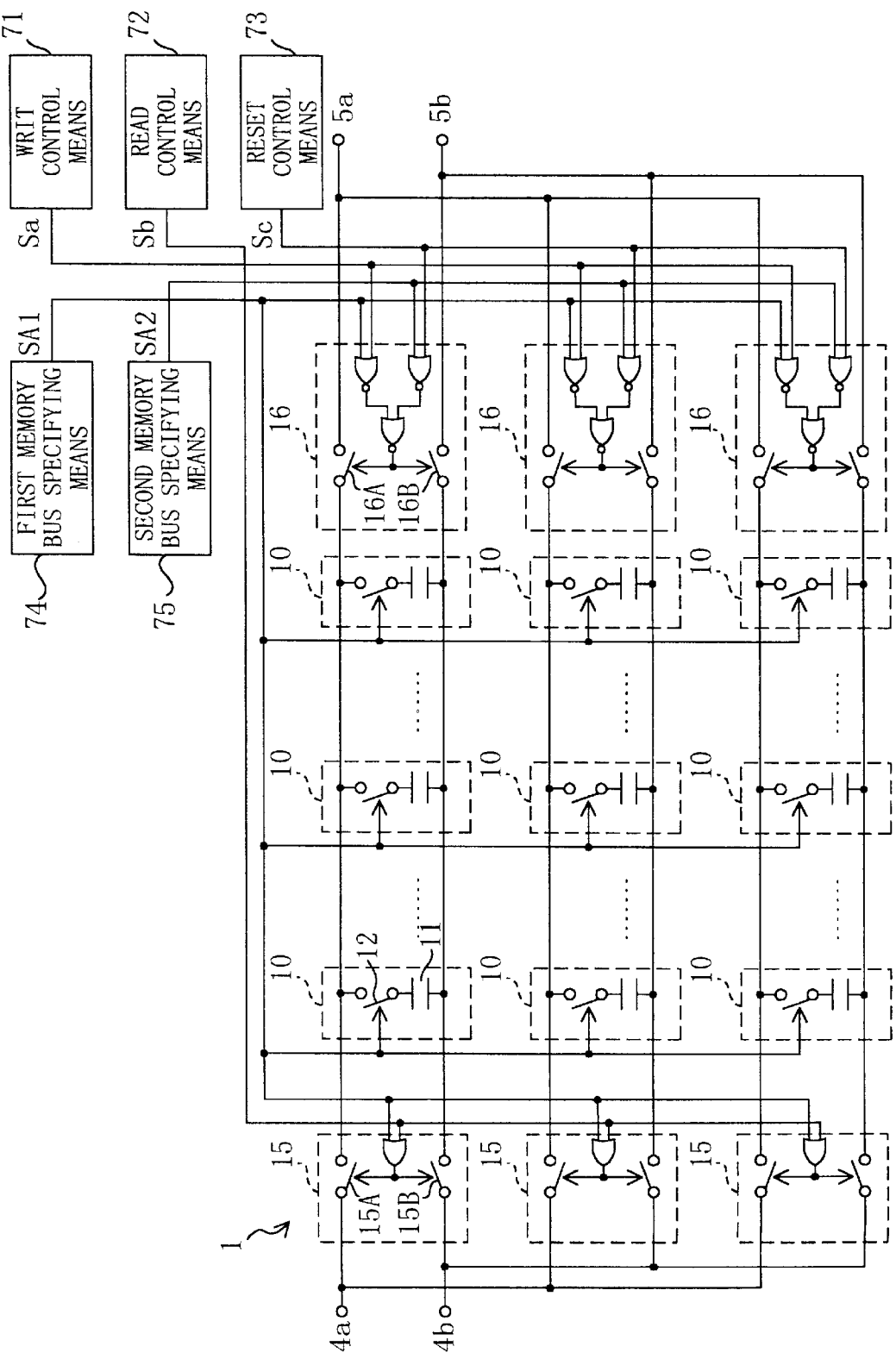
FIG. 21 is a diagram for showing the specific configuration of the analog FIFO memory of the third embodiment.

FIG. 21 is a diagram for showing a specific configuration of the analog FIFO memory of this embodiment. In FIG. 21, merely terminals 4a and 4b of the write circuit 2 and terminals 5a and 5b of the read circuit 3 are shown, and the write circuit 2 and the read circuit 3 are omitted. As is shown in FIG. 21, for the purpose of realizing the aforementioned system of this embodiment, the analog FIFO memory comprises write control means 71 for generating a signal Sa for driving the write operation, read control means 72 for generating a signal Sb for driving the read operation, reset control means 73 for generating a signal Sc for driving the reset operation, first memory bus specifying means 74 for generating a signal SA1 for specifying the memory bus for the read operation and the write operation, and second memory bus specifying means 75 for generating a signal SA2 for specifying a memory bus for the reset operation.

Figure 22:
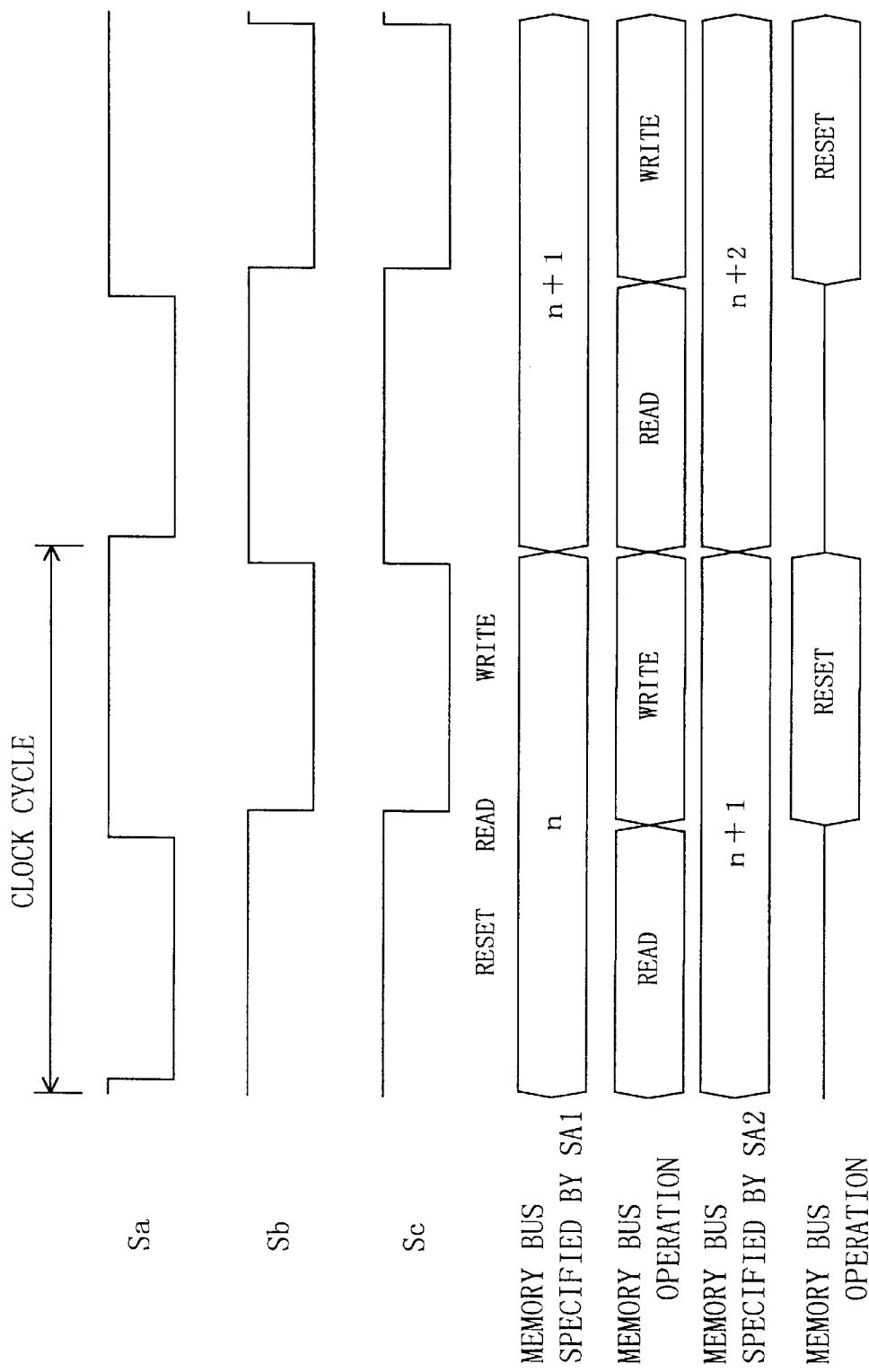
FIG. 22 is a timing chart for showing the operation of the analog FIFO memory of the third embodiment shown in FIG. 21.

FIG. 22 is a timing chart for the operation of the analog FIFO memory of FIG. 21, wherein variation with time of the signals Sa, Sb and Sc and variation with time of addresses of the memory buses specified by the signals SA1 and SA2 are shown. In this case, all the signals are assumed to be low-active.

A memory bus for the reset operation is always a memory bus on which the read/write operation is subsequently carried out. Accordingly, the address of a memory bus specified by the signal SA2 generated by the second memory bus specifying means 75 is the address of a memory bus subsequent to the memory bus specified by the signal SA1 generated by the first memory bus specifying means 74.

The input means 15 of each memory bus circuit 1 drives the switches 15A and 15B in accordance with the signal Sa generated by the write control means 71 merely when its address is specified by the signal SA1 generated by the first memory bus specifying means 74. Furthermore, the output means 16 of each memory bus circuit 1 drives the switches 16A and 16B in accordance with the signal Sb generated by the read control means 72 when its address is specified by the signal SA1 generated by the first memory bus specifying means 74, and drives the switches 16A and 16B in accordance with the signal Sc generated by the reset control means 73 when its address is specified by the signal SA2 generated by the second memory bus specifying means 75.

In this manner, the operation shown in FIGS. 20(a) through 20(d) can be specifically realized through the control as is shown in FIG. 22 in the circuit configuration shown in FIG. 21.

(Embodiment 4)

Figure 23:
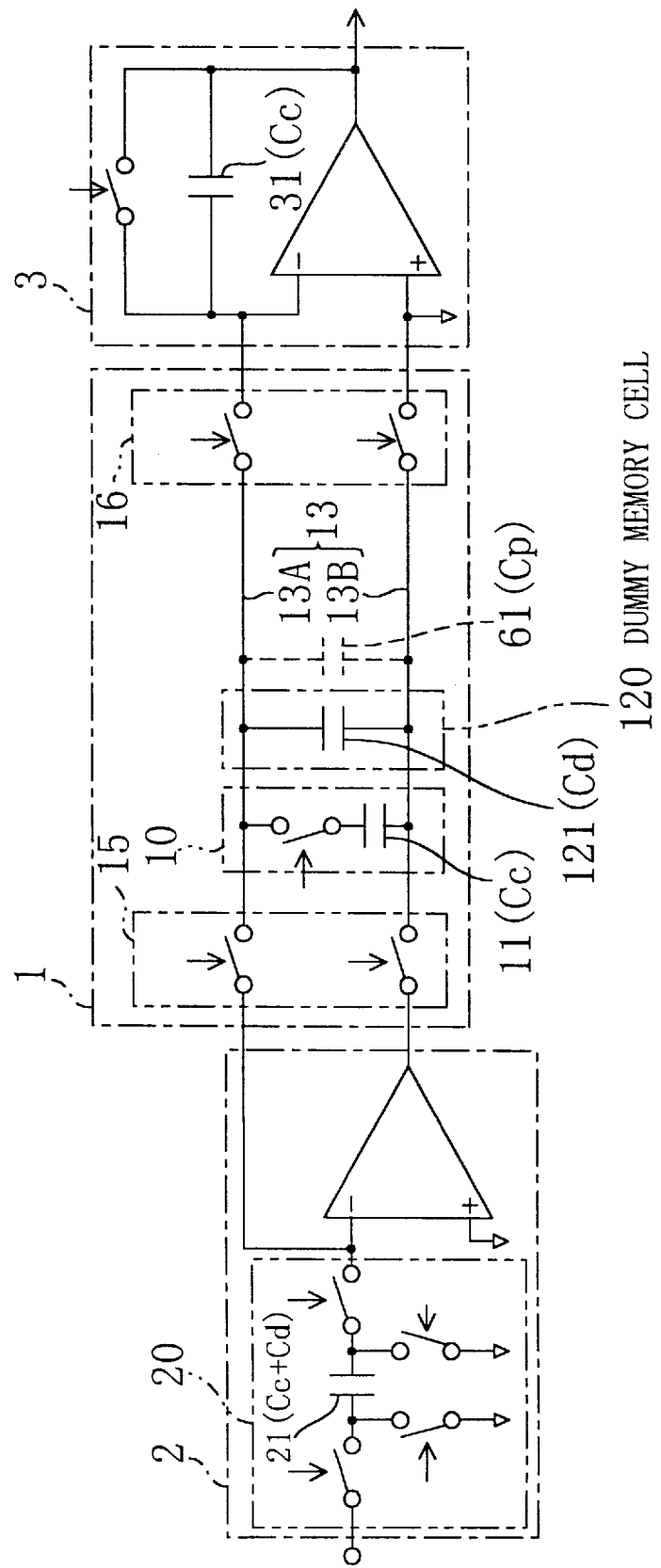
FIG. 23 is a diagram for showing the configuration of an analog FIFO memory according to a fourth embodiment of the invention.

FIG. 23 is a circuit diagram for showing the configuration of an analog FIFO memory according to a fourth embodiment of the invention. In the analog FIFO memory of this embodiment, as is shown in FIG. 23, a memory bus circuit 1 is previously provided with a dummy capacitance device 121 between first and second bus lines 13A and 13B. The dummy capacitance device 121 forms a dummy memory cell 120.

In the following description, the dummy capacitance device 121 is assumed to have a capacitance value Cd, an intra-line capacitance 61 between the first and second bus lines 13A and 13B is assumed to have a capacitance value Cp, a capacitance device 11 of a memory cell 10 is assumed to have a capacitance value Cc, a capacitance device 31 of a read circuit 3 is assumed to have a capacitance value Cc, and a capacitance device 21 of a write circuit 2 is assumed to have a capacitance value (Cc+Cd). In this case, when an input analog signal has a voltage Vin, a charge Q1 stored in the capacitance device 21 of the write circuit 2 is represented as follows:

$$Q1 = Vin \ (Cc+Cd) \qquad (7)$$

In the write operation, this charge Q1 is stored in the capacitance device 11 of the memory cell 10, the dummy capacitance device 121 and the intra-line capacitance 61 dividedly in accordance with their capacitance values. At this point, a charge Q2 stored in the capacitance device 11 of the memory cell 10 is represented as follows:

$$Q2 = Vin \cdot (Cc+Cd)Cc/(Cc+Cd+Cp) \qquad (8)$$

The charge stored in the dummy capacitance device 121 and the intra-line capacitance 61 excluding that stored in the capacitance device 11 of the memory cell 10 is lost because the first and second bus lines 13A and 13B are reset through the reset operation. Accordingly, a charge to be transferred to the capacitance device 31 of the read circuit 3 in the read operation is merely the charge Q2 stored in the capacitance device 11 of the memory cell 10. Therefore, an output voltage Vout resulting from this charge Q2 is represented as follows:

$$\begin{aligned} Vout &= Q2 \cdot Cc \\ &= Vin \cdot (Cc + Cd) / (Cc + Cd + Cp) \\ &= Vin / (1 + Cp / (Cc + Cd)) \quad \ldots (9) \end{aligned}$$

On the basis of Formula (9), the influence of the intra-line capacitance 61 on the output voltage Vout can be represented as follows:

$$Cp/(Cc+Cd) \qquad (10)$$

In other words, the influence of the intra-line capacitance 61 on the output voltage Vout is reduced by the dummy capacitance device 121, and when the capacitance value Cd of the dummy capacitance device 120 is larger, the intra-line capacitance 61 less affects the output voltage Vout.

As described above, by providing the dummy memory cell having the capacitance device connected with the memory bus, the influence of the parasitic capacitance of the memory bus on the input/output operation of the analog FIFO memory can be reduced in this embodiment.

When this embodiment is combined with the second embodiment, the effects can be more remarkably exhibited. For example, even when the analog FIFO memory is used for delaying a TV signal, the influence of the parasitic capacitance of the memory bus can be reduced.

As is obvious from Formula (10), when the dummy capacitance device 121 has a larger capacitance value Cd, the influence of the intra-line capacitance 61 on the output voltage Vout is reduced. However, when the capacitance value Cd of the dummy capacitance device 120 is increased, it is necessary to set settling time in the charge transfer from the write circuit 2 to the memory cell 10 at a larger value in accordance with the increase of the capacitance value Cd. In the conventional analog FIFO memory, a high speed operation is required, for example, to be used for delaying a TV signal, and hence, it is very difficult to set the settling time in the charge transfer from the write circuit 2 to the memory cell 10 at a large value.

However, when this embodiment is combined with the second embodiment, the time allocated to the write operation can be increased to twice as long as the conventional time due to the parallel operation of the first and second memory units 101a and 101b. Accordingly, the settling time in the charge transfer from the write circuit 2 to the memory cell 10 can be set at a sufficiently large value. This allows the dummy capacitance device 121 to have a capacitance value Cd sufficiently large for reducing the influence of the parasitic capacitance of the memory bus on the input/output operation of the analog FIFO memory.

(Embodiment 5)

In the fourth embodiment, the dummy memory cell is previously provided to the memory bus, so that the influence of the parasitic capacitance of the memory bus can be reduced. In a fifth embodiment of the invention, the position of the dummy memory cell of the fourth embodiment in the circuit layout is considered, so as to suppress fluctuation in the input/output characteristic of an analog FIFO memory depending upon the position of a memory cell to be read/written.

Figure 24A:
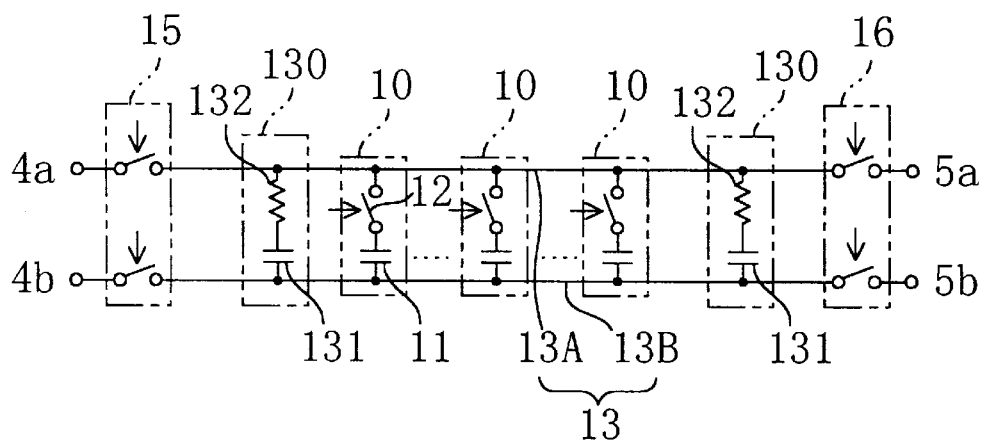
FIG. 24(a) is a diagram for showing the configuration of a memory bus circuit in an analog FIFO memory according to a fifth embodiment of the invention and FIG. 24(b) is a diagram of an equivalent circuit of the memory bus circuit of FIG. 24(a) in which a switch of one memory cell is in an on-state.

FIG. 24(a) is a circuit diagram for showing the configuration of a memory bus circuit 1 of an analog FIFO memory according to the fifth embodiment of the invention. In this embodiment, as is shown in FIG. 24(a), the dummy memory cell 120 of the fourth embodiment is divided into two dummy memory cells 130, so that the dummy memory cells 130 can be disposed near the ends of a memory bus 13 so as to sandwich memory cells 10. Each of the dummy memory cells 130 includes a capacitance device 131 having the same capacitance value as a capacitance device 11 of the memory cell 10, and a resistance device 132 having the same resistance value as an on-resistance of a switch 12 of the memory cell 10. In this embodiment, the dummy memory cells 130 in the number as large as possible are disposed near the ends of the memory bus 13.

Figure 24B:
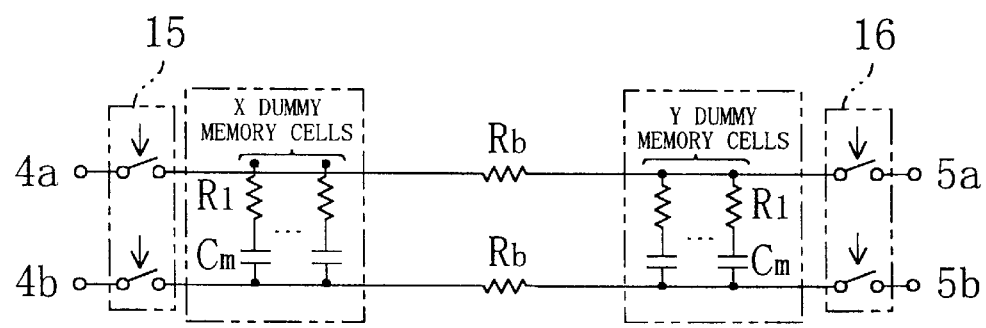

FIG. 24(b) is a diagram of an equivalent circuit of the memory bus circuit 1 of FIG. 24(a) where the switch of one memory cell 10 is in an on-state. In FIG. 24(b), first and second bus lines 13A and 13B are assumed to have a line resistance Rb and each memory cell 10 is assumed to have a switch resistance R1 and a capacitance value Cm.

Since the memory bus 13 is provided with the plural memory cells 10, the transfer path of a charge can be physically varied depending upon to which memory cell 10 a charge is transferred. Variation in the impedance of the memory bus 13 is largest when the position of the memory cell 10 to be read/written is changed from one closest to the input port to another closest to the output port. The impedance variation of the memory bus 13 at this point will be calculated.

It is assumed that the numbers of the dummy memory cells 130 are (y−1) near the input end of the memory bus 13 and x near the output end. When the memory cell 10 to be read/written is disposed closest to the input port, the y memory cells including the dummy memory cells 130 are disposed in parallel on a side closer to the input end of the memory bus 13, and the x memory cells including the dummy memory cells 130 are disposed in parallel on another side closer to the output end. In this case, an impedance Z1 on the basis of the input end of the memory bus 13 can be calculated as follows:

$$Z1 = \{2Rb \cdot x(R1+1/sCm)+(R1+1/sCm)^2\}/\{2Rb \cdot xy+(x+y)(R1+1/sCm)\} \qquad (11)$$

On the other hand, when the memory cell 10 to be read/written is disposed closest to the output port, the (y−1) memory cells including the dummy memory cells 130 are disposed in parallel on the side closer to the input end of the memory bus 13, and the (x+1) memory cells including the dummy memory cells 130 are disposed in parallel on the side closer to the output end. At this point, assuming that the number of the dummy memory cells 130 disposed on the side closer to the input end of the memory bus 13 is equal to the number of the dummy memory cells 130 disposed on the side closer to the output end, the following relationship holds:

$$y-1 = x \qquad (12)$$

Therefore, the x memory cells including the dummy memory cells 130 are disposed in parallel on the side closer to the input end of the memory bus 13, and the y memory cells including the dummy memory cells 130 are disposed in parallel on the side closer to the output end. In this case, an impedance Z2 on the basis of the input end of the memory bus 13 can be calculated by replacing "x" with "y" in Formula (11) as follows:

$$Z2=\{2Rb\cdot y(R1+1/sCm)+(R1+1/sCm)^2\}/\{2Rb\cdot xy+(x+y)(R1+1/sCm)\} \quad (13)$$

Accordingly, impedance variation Zc caused when the position of the memory cell 10 to be read/written is changed from that closest to the input end of the memory bus 13 to that closest to the output end can be obtained by subtracting the impedance Z1 of Formula (11) from the impedance Z2 of Formula (13) as follows:

$$Zc=2Rb\cdot(R1+1/sCm)/\{2Rb\cdot xy+(x+y)(R1+1/sCm)\} \quad (14)$$

At this point, when R1>>Rb, Formula (14) can be approximated as follows:

$$Zc=2Rb/(x+y) \quad (15)$$

As is understood from Formula (15), the influence of the line resistance Rb on the impedance variation Zc is decreased to 1/(x+y). Specifically, when the dummy memory cells 130 are disposed at the ends of the memory bus 13 so as to sandwich the memory cells 10, the impedance variation of the memory bus 13 in accordance with the positional change of the memory cell 10 to be read/written can be suppressed.

As described above, in this embodiment, the impedance of the memory bus can be averaged by providing the dummy memory cells at the ends of the memory bus. As a result, the fluctuation in the input/output characteristic of the analog FIFO memory depending upon the position of the memory cell to be read/written can be suppressed, so that the input/output characteristic can be stabilized regardless of the position of the memory cell to be read/written.

(Embodiment 6)

A sixth embodiment of the invention relates to a layout of a transistor for decreasing the parasitic capacitance itself of a memory bus.

Figure 25A:
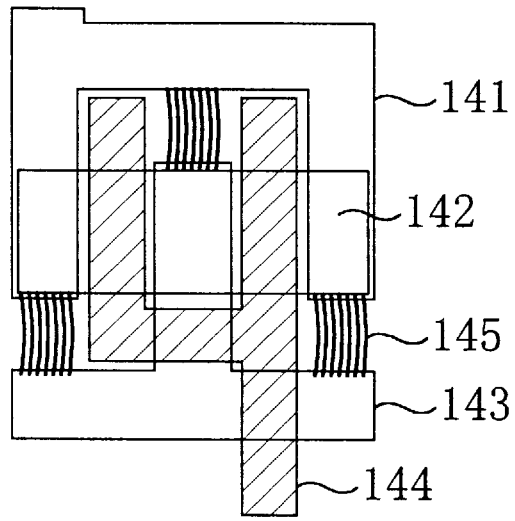
Figure 25B:
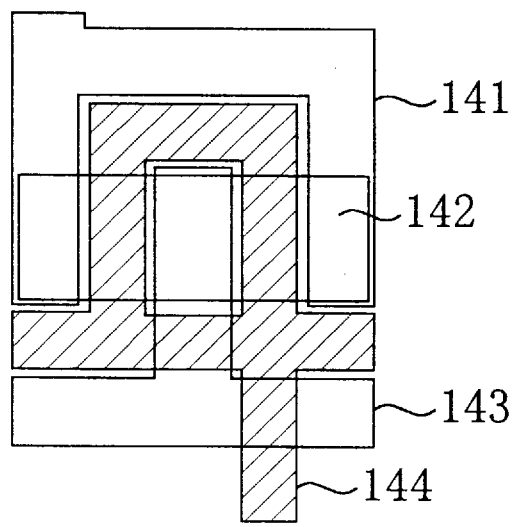
Figure 25C:
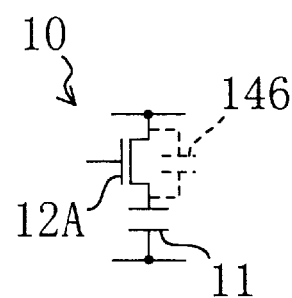
Figure 26A:
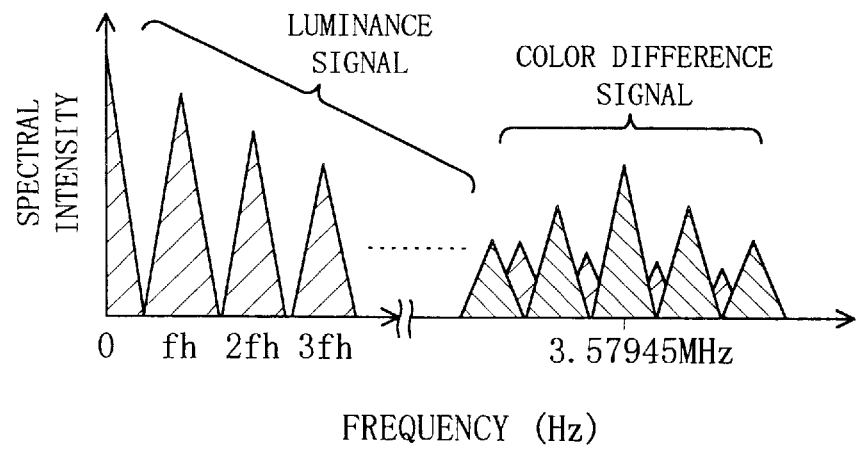
FIG. 26(a) is a diagram of the frequency spectrum of an NTSC color TV signal and FIG. 26(b) is a diagram for showing the frequency characteristic of a Y/C separation filter.
Figure 26B:
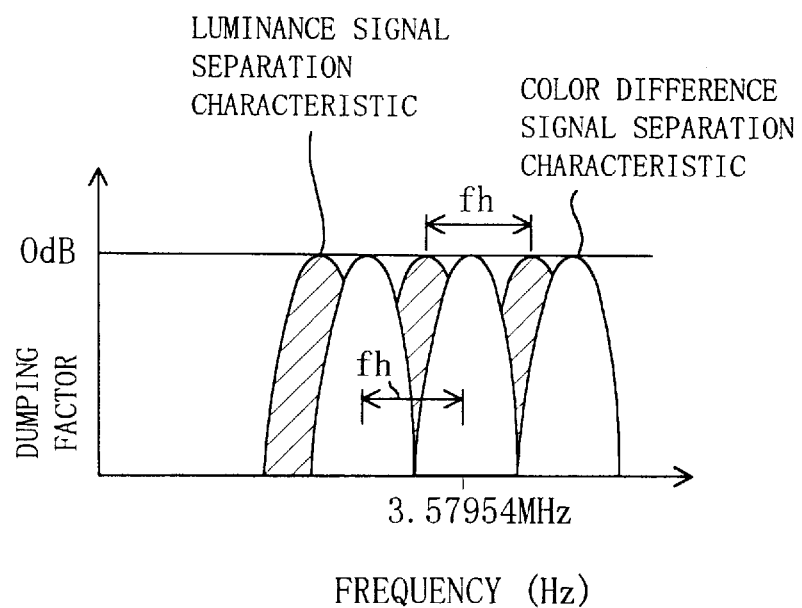
Figure 27A:
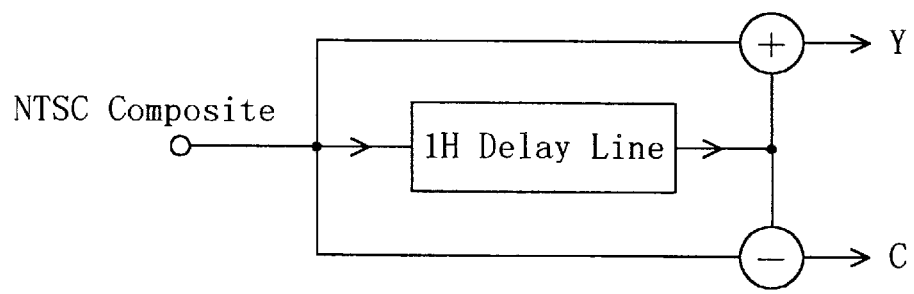
FIG. 27(a) is a diagram for showing the outline of the configuration of a circuit for conducting Y/C separation on an NTSC color TV signal and FIG. 27(b) is a diagram for showing the configuration outline of a TV signal LSI externally provided with a CCD circuit.
Figure 27B:
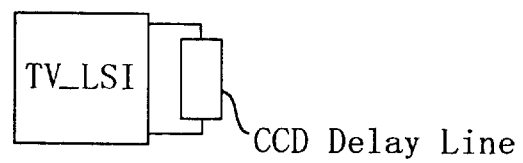
Figure 27C:
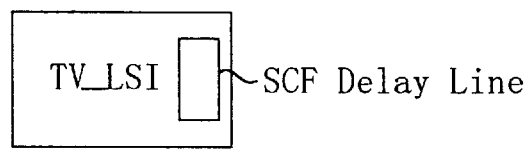
FIG. 27(c) is a diagram for showing the configuration outline of a one-chip TV signal LSI.
Figure 28A:
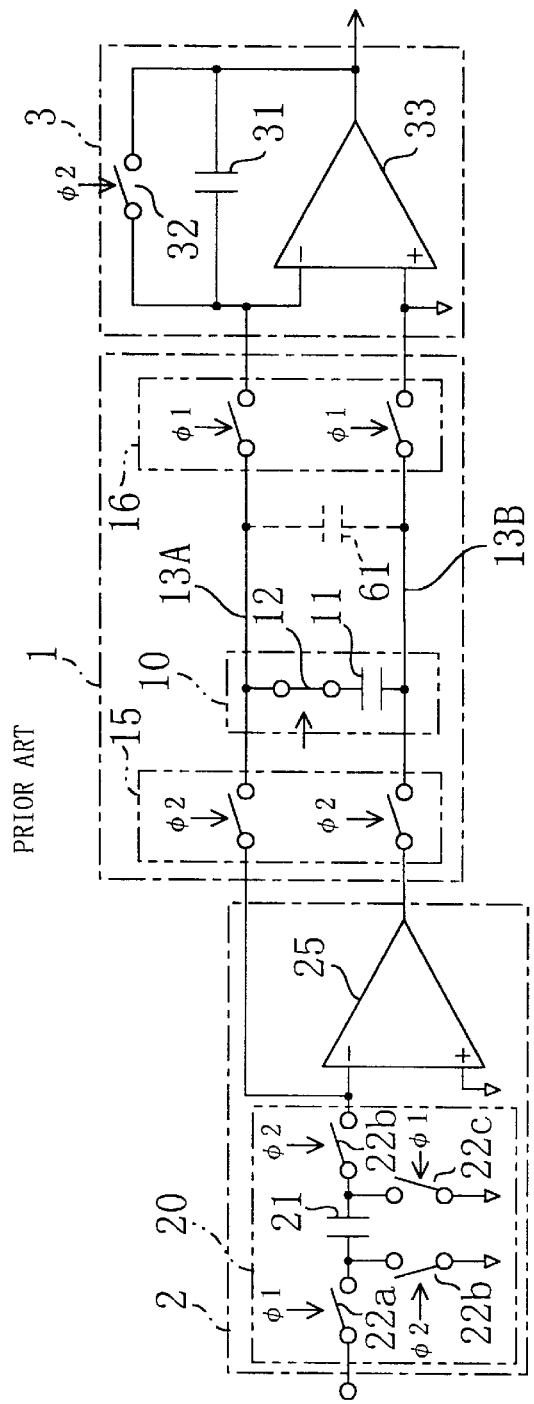
FIG. 28(a) is a diagram for showing the fundamental configuration of a conventional analog FIFO memory and FIG. 28(b) is a timing chart for a clock signal for driving the analog FIFO memory of FIG. 28(a)
Figure 28B:
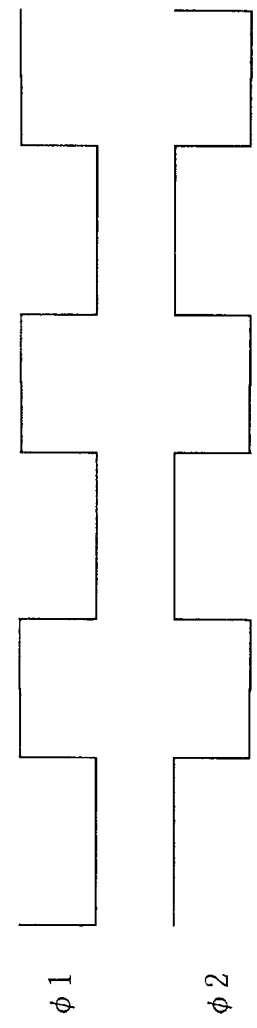

FIGS. 25(a) through 25(c) are diagrams for illustrating the sixth embodiment, wherein FIG. 25(a) is a diagram of a conventional layout of a transistor, FIG. 25(b) is a diagram of the layout of a transistor according to this embodiment, and FIG. 25(c) is a schematic diagram for showing a drain-source capacitance parasitic on a transistor working as a switch in a memory cell.

In order to decrease the intra-line capacitance parasitic on the memory bus, a distance between the bus lines is required to be as large as possible. However, as is shown in FIG. 25(c), a CMOS transistor 12A working as a switch 12 of a memory cell 10 has a drain-source capacitance 146 unavoidably due to the layout. Therefore, an intra-line capacitance including a series connection of a capacitance device 11 of the memory cell 10 and the drain-source capacitance 146 of the CMOS transistor 12A is parasitic on the memory bus, and the intra-line capacitance has a capacitance value approximately equal to that of the drain-source capacitance 146. Such an intra-line capacitance cannot be eliminated as far as the drain-source capacitance 146 of the CMOS transistor 12A remains, and is increased as the number of the memory cells 10 is increased. Therefore, this becomes a significant problem in integrating a large number of memory cells 10.

In view of the aforementioned problem, this embodiment proposes a layout of a transistor where no line of electric force exists between the drain and the source. A capacitance is originally formed by a line of electric force extending from one electrode to another electrode. Therefore, when no line of electric force exists, no capacitance is formed. In this embodiment, attention is paid to this fact, and a gate electrode is disposed between the drain and the source, so that the lines of electric force extending from the drain and the source can be ended on the gate electrode. Thus, the line of electric force is prevented from extending between the source and the drain, thereby preventing the formation of the drain-source capacitance.

As is shown in FIG. 25(a), in the conventional layout of the transistor, lines of electric force 145 are present in portions between a drain 143 and a source 141 where a gate electrode 144 is not disposed. Thus, the drain-source capacitance is formed.

In contrast, in the layout of the transistor according to this embodiment, as is shown in FIG. 25(b), a gate electrode 144 is formed between a drain 143 and a source 141 without leaving any gap, and hence, no line of electric force can be present between the drain and the source. Such a layout can prevent the formation of the drain-source capacitance.

As described above, according to this embodiment, the CMOS transistor used as a switching device in the memory cell adopts the layout where no line of electric force exists between the drain and the source, so that the formation of the drain-source capacitance can be prevented. As a result, the parasitic capacitance itself of the memory bus can be minimized.

The layout of the transistor of this embodiment is applicable not only to a transistor serving as a switch in a memory cell of an analog FIFO memory but also to any transistor serving as a switching device for controlling connection between a device and a signal line, in which the same effect as that of this embodiment can be exhibited.

Figure 30A:
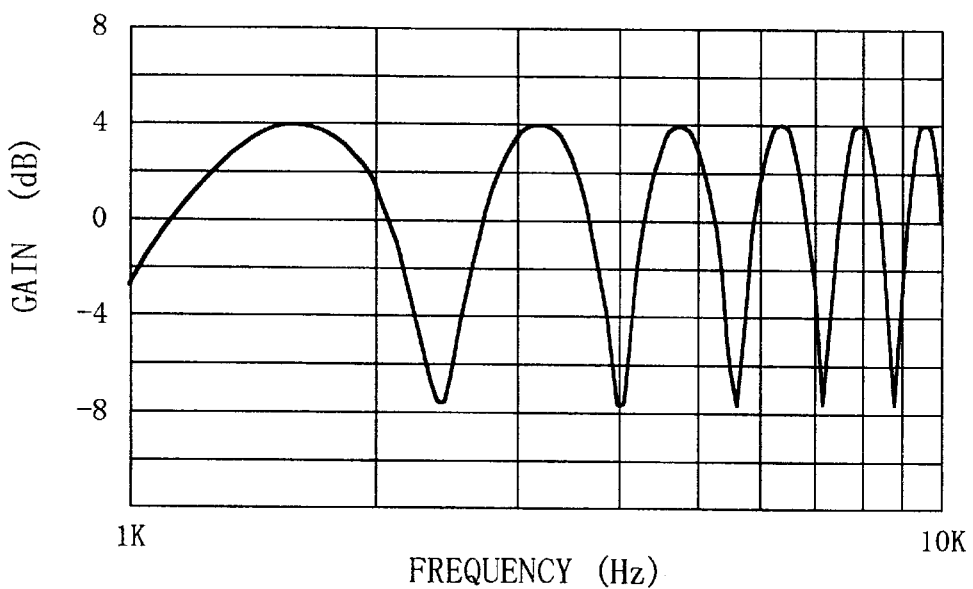
Figure 30B:
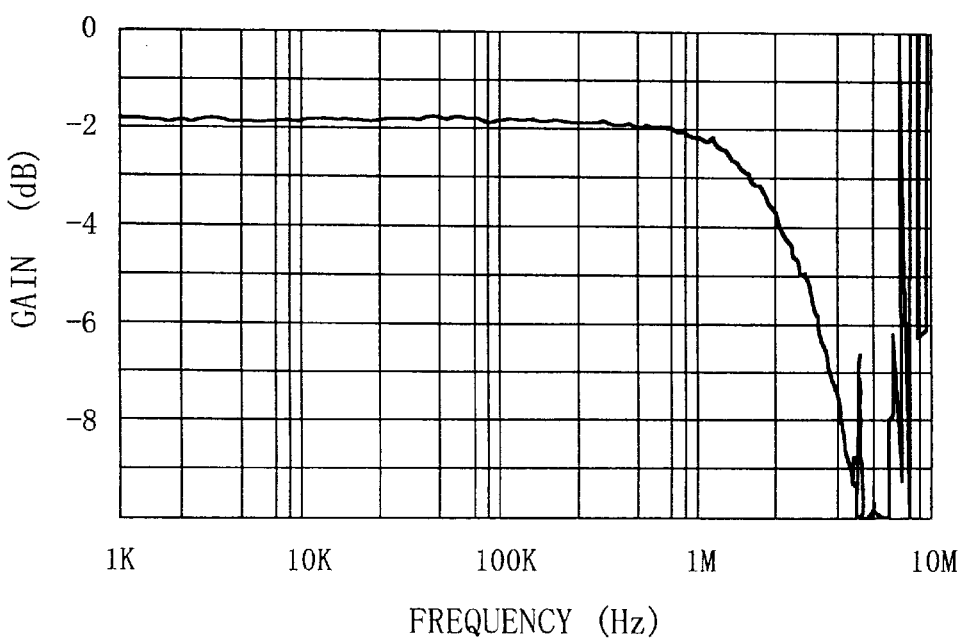

FIGS. 30(a) and 30(b) are diagrams for illustrating the effect of the reset operation of this invention, wherein FIG. 30(a) shows the frequency characteristic of an analog FIFO memory which does not carry out the reset operation and FIG. 30(b) shows the frequency characteristic of an analog FIFO memory which carries out the reset operation of this invention. As is understood from FIGS. 30(a) and 30(b), the reset operation of this invention makes flat the frequency characteristic of the analog FIFO memory, so as to improve the input/output characteristic of the analog FIFO memory as compared with the conventional one.

What is claimed is:

1. An analog FIFO memory for outputting, in an input order, an input analog signal with a predetermined time delay, comprising a memory bus circuit including a plurality of memory cells for storing an analog signal; and a memory bus connected with said memory cells for transferring an analog signal, wherein a read operation for reading out an analog signal through said memory bus and a write operation for writing in an analog signal through said memory bus are conducted successively on said memory cells in a predetermined order, and a reset operation for setting said memory bus at a predetermined potential is conducted prior to the read operation in order to remove a charge stored in a parasitic capacitance of said memory bus.

2. The analog FIFO memory of claim 1, wherein each of said memory cells includes a capacitance device for storing an analog signal in the form of charge, and a switch for controlling connection between said capacitance device and said memory bus, and when one memory cell is selected to be read/written, said switch of said selected memory cell is in an on-state during the read operation and the write operation.

3. The analog FIFO memory of claim 2, further comprising:
   a write circuit for writing an analog signal in said memory cells of said memory bus circuit through said memory bus; and
   a read circuit for reading an analog signal from said memory cells of said memory bus circuit through said memory bus,
   wherein said memory bus circuit further includes:
      input means for connecting said write circuit with said memory bus in the write operation and disconnecting said write circuit from said memory bus in the read operation; and
      output means for connecting said read circuit with said memory bus in the read operation and disconnecting said read circuit from said memory bus in the write operation, and
   in the reset operation, said memory bus circuit disconnects said write circuit from said memory bus by using said input means and connects said read circuit with said memory bus by using said output means, said switches of all of said memory cells connected with said memory bus are turned off, and said read circuit sets a potential of an analog signal input terminal connected with said memory bus through said output means at a predetermined potential.

4. The analog FIFO memory of claim 3,
   wherein said memory bus includes first and second bus lines,
   said read circuit includes:
   an operational amplifier whose negative-phase input terminal is connected with said first bus line through said output means and positive-phase input terminal is connected with said second bus line through said output means and is set at a predetermined potential;
   a capacitance device disposed between said negative-phase input terminal and an output terminal of said operational amplifier for storing an analog signal in the form of charge; and
   a switch disposed between said negative-phase input terminal and said output terminal of said operational amplifier in parallel with said capacitance device, for controlling connection between said negative-phase input terminal and said output terminal of said operational amplifier, and
   said switch of said read circuit is in an on-state in the reset operation and is in an off-state in the read operation and the write operation.

5. The analog FIFO memory of claim 4,
   wherein said read circuit includes, in stead of said switch, a first switch for controlling connection between said negative-phase input terminal of said operational amplifier and a power supply with said predetermined potential, and a second switch for controlling connection between said output terminal of said operational amplifier and a power supply with said predetermined potential, and
   said first and second switches are in an on-state in the reset operation and are in an off-state in the read operation and the write operation.

6. The analog FIFO memory of claim 1, further comprising plural memory units each including said memory bus circuit,
   wherein said plural memory units conduct the read operation and the write operation in parallel in a manner that one memory unit conducts the read operation while another memory unit is conducting the write operation, and
   each of said memory units conducts the reset operation prior to the read operation.

7. The analog FIFO memory of claim 6,
   wherein while one of said plural memory units is conducting the reset operation and subsequently the read operation, another memory unit conducts the write operation.

8. The analog FIFO memory of claim 6,
   wherein while one of said plural memory units is conducting the read operation, another memory unit conducts the write operation and subsequently the reset operation.

9. The analog FIFO memory of claim 6,
   wherein the number of said plural memory units is three or more, and
   while one of said plural memory units is conducting the read operation and another memory unit is conducting the write operation, the other memory unit conducts the reset operation.

10. The analog FIFO memory of claim 1,
    wherein said memory bus circuit is plural in number,
    the read operation and the write operation are conducted in one of said plural memory bus circuits, and subsequently in another memory bus circuit, and
    while the read operation and the write operation are conducted in one of said plural memory bus circuits, the reset operation is conducted in another memory bus circuit in which the read operation and the write operation are subsequently conducted.

11. The analog FIFO memory of claim 10,
    wherein vertical addressing is conducted on said memory cells in each of said memory bus circuits.

12. An analog FIFO memory for outputting, in an input order, an input analog signal with a predetermined time delay, comprising: a memory bus circuit including a plurality of memory cells for storing an analog signal, and a memory bus connected with said memory cells for transferring an analog signal,
    wherein each of said memory cells includes:
       a capacitance device for storing an analog signal in the form of charge; and
       a switch for controlling connection between said capacitance device and said memory bus,
    when one memory cell is selected to be read/written, said switch of said selected memory cell is in an on-state in the read operation and the write operation, and
    said memory bus circuit further includes a dummy memory cell having a capacitance device connected with said memory bus.

13. The analog FIFO memory of claim 12,
    wherein a plurality of said dummy memory cells are disposed at ends of said memory bus so as to sandwich said memory cells.

* * * * *

UNITED STATES PATENT AND TRADEMARK OFFICE
CERTIFICATE OF CORRECTION

PATENT NO. : 5,822,236
DATED : October 13, 1998
INVENTOR(S) : DOSHO et al.

It is certified that error appears in the above-identified patent and that said Letters Patent is hereby corrected as shown below:

Col. 22, line 49: Delete "comprising a memory" and insert --comprising: a memory--

Signed and Sealed this

Ninth Day of February, 1999

Attest:

Attesting Officer

Acting Commissioner of Patents and Trademarks